United States Patent
Enoki et al.

(10) Patent No.: US 7,049,371 B2
(45) Date of Patent: May 23, 2006

(54) MATERIAL FOR AN INSULATING FILM, COATING VARNISH FOR AN INSULATING FILM, AND INSULATING FILM AND SEMICONDUCTOR DEVICE USING THE SAME

(75) Inventors: Takashi Enoki, Yokohama (JP); Hidenori Saito, Yokohama (JP); Nobuhiro Higashida, Izumiotsu (JP); Yuichi Ishida, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 126 days.

(21) Appl. No.: 10/380,872

(22) PCT Filed: Sep. 20, 2001

(86) PCT No.: PCT/JP01/08210

§ 371 (c)(1),
(2), (4) Date: Mar. 19, 2003

(87) PCT Pub. No.: WO02/24788

PCT Pub. Date: Mar. 28, 2002

(65) Prior Publication Data

US 2004/0002572 A1   Jan. 1, 2004

(30) Foreign Application Priority Data

Sep. 22, 2000  (JP) .............................. 200-288271
Dec. 28, 2000  (JP) ............................. 2000-401237

(51) Int. Cl.
   *C08L 79/00* (2006.01)
(52) U.S. Cl. ..................... 525/183; 525/184; 525/421; 525/424; 525/425; 524/514; 524/538
(58) Field of Classification Search ............... 525/421, 525/183, 104, 425, 424; 524/514, 538
See application file for complete search history.

(56) References Cited

U.S. PATENT DOCUMENTS

| | | | |
|---|---|---|---|
| 3,883,452 A | 5/1975 | Scheuerlein et al. | |
| 5,236,980 A | 8/1993 | Jenekhe et al. | |
| 5,281,489 A | 1/1994 | Mori et al. | |
| 5,708,128 A | 1/1998 | Oikawa et al. | |
| 5,776,990 A | 7/1998 | Hedrick et al. | |
| 6,380,271 B1* | 4/2002 | Enoki et al. ................ | 521/77 |

FOREIGN PATENT DOCUMENTS

| | | |
|---|---|---|
| EP | 0 517542 | 12/1992 |
| EP | 0 532 798 | 3/1993 |
| JP | 2000-344896 | 12/2000 |
| JP | 2001-283638 | 10/2001 |
| WO | WO 95/12628 | 5/1995 |

OTHER PUBLICATIONS

T. Hashimoto, M. Shibayama, M. Fujimura and H. Kawai, Microphase Separation and the Polymer-Polymer Interphase in Block Polymers, "Block Copolymers-Science and Technology", p. 63, Ed. By D.J. Meier (Academic Pub., 1983).

* cited by examiner

*Primary Examiner*—Ana Woodward
(74) *Attorney, Agent, or Firm*—Smith, Gambrell & Russell, LLP

(57) ABSTRACT

A material for an insulating film which comprises a copolymer obtained by reacting a polyamide having a specific structure and a reactive oligomer as a component forming the film; a coating varnish for an insulating film which comprises this material and an organic solvent; an insulating film which comprises a layer of a resin comprising as a main structure a polybenzoxazole which is obtained by treating the above material or the above coating varnish by heating so that condensation reaction and crosslinking reaction take place and has fine pores; and a semiconductor device which comprises an insulating interlayer film for multi-layer wiring comprising the insulating film and/or a surface protective film comprising the insulating film. Excellent electrical, thermal and mechanical properties are exhibited and a low permittivity can be achieved.

10 Claims, No Drawings

MATERIAL FOR AN INSULATING FILM, COATING VARNISH FOR AN INSULATING FILM, AND INSULATING FILM AND SEMICONDUCTOR DEVICE USING THE SAME

BACKGROUND OF THE INVENTION

1. Field of the Invention

The present invention relates to a material for an insulating film, a coating varnish for an insulating film and an insulating film and a semiconductor using the material or the varnish. More particularly, the present invention relates to a material for an insulating film which exhibits excellent electrical, thermal and mechanical properties, can achieve a low permittivity and is advantageously used for insulating interlayer films and surface protective films in semiconductors, insulating interlayer films of multi-layer circuits, cover coats of flexible copper clad laminates, solder resist films and liquid crystal-aligning films, a coating varnish for an insulating film comprising this material, an insulating film using the material or the varnish and a semiconductor using the material or the varnish.

2. Description of Related Art

As the materials for semiconductors, inorganic materials and organic materials are used in various portions in accordance with the necessary properties. For example, as the insulating interlayer film for semiconductors, films of inorganic oxides such as silicon dioxide prepared in accordance with the chemical vapor deposition process are used. However, as the speed of semiconductors increases and the performance is still more improved, a problem arises with the films of inorganic oxides in that the permittivity is high. As a method to overcome this problem, application of organic materials has been studied.

The organic materials applied to semiconductors are, for example, polyimide resins exhibiting excellent heat resistance and electrical and mechanical properties. The polyimide resins are used for solder resist films, cover lays and liquid crystal-aligning films. However, since the polyimide resins have two carbonyl groups on the imide ring, in general, problems are found with respect to water absorption and electrical properties. To overcome these problems, improvement in the water absorption and the electrical properties has been attempted by introducing fluorine or groups having fluorine into the organic macromolecule and some of the improved resins are practically used. Polybenzoxazole resins are the resins exhibiting more excellent heat resistance, water absorption and electrical properties than those of the polyimide resins. Application of the polybenzoxazole resins to various fields has also been attempted. Examples of the polybenzoxazole resin include resins having the structure derived from 4,4'-diamino-3,3'-dihydroxybiphenyl and terephthalic acid and resins having the structure derived from 2,2-bis(3-amino-4-hydroxyphenyl)hexafluoropropane and terephthalic acid.

However, it is the actual present situation that, in the most advanced field requiring more excellent properties such as more excellent heat resistance, electrical properties and water absorption, no materials satisfying the all requirements have been obtained yet. Some materials exhibit insufficient electrical properties such as permittivity although the heat resistance is excellent. The introduction of fluorine causes a decrease in the heat resistance although the electrical properties can be improved. In particular, when organic materials are applied to insulating interlayer films for semiconductors, it is required that the heat resistance, the mechanical properties and the water absorption be as excellent as those of inorganic materials and, moreover, a lower permittivity is required.

In response to the requirements for further improvements in the properties, decreasing density of films of inorganic oxides, which are inorganic materials, by forming fine pores in the films is studied in order to achieve a decrease in the specific permittivity. The air has a specific permittivity of 1. Therefore, the decrease in the specific permittivity by introduction of the air in the film may be suggested by the method described in the specification of the U.S. Pat. No. 3,883,452 in which a foamed polymer having pores having an average diameter of about 20 µm is formed. However, to prepare an effective insulating material by introducing the air into a film, it is necessary that a uniform distribution of the specific permittivity be achieved in. a film having a thickness of an order of submicrometer. It is also necessary that the film have sufficient mechanical properties for enduring various steps in the production process. It is the actual present situation that no inorganic materials overcoming the above problems have been obtained yet.

On the other hand, as the technology for obtaining fine pores having a size of an order of submicrometer in organic materials, a technology in which a resin having fine pores having a size of an order of submicrometer is formed by a heat treatment of a block copolymer is disclosed (U.S. Pat. No. 5,776,990). The phase separation of a size of an order of submicrometer in block copolymers has been known [T. Hashimoto, M. Shibayama, M. Fujimura and H. Kawai, "Microphase Separation and the Polymer-polymer Interphase in Block Polymers" in "Block Copolymers-Science and Technology", p.63, Ed. by D. J. Meier (Academic Pub., 1983)]. It is also well known in the field of the macromolecular chemistry that polymers having a low ceiling temperature are easily decomposed. However, to obtain a resin composition having fine pores while the requirements not only for the specific permittivity but also for the mechanical properties, the electrical properties, the water absorption and the heat resistance are satisfied, the combination of the resin, the technology of forming blocks and the components decomposable under heating is extremely limited. It is the actual present situation that no technology satisfying the entire requirements can be found.

SUMMARY OF THE INVENTION

The present invention has an object of providing a material for an insulating film exhibiting excellent electrical properties, thermal properties and mechanical properties and can achieve a low permittivity, a coating varnish for an insulating film containing the material, an insulating film using the material or the varnish and a semiconductor device having the insulating film.

As the result of extensive studies by the present inventors to achieve the above object, it was found that the above object can be achieved by using a copolymer obtained by reacting a polyamide having a specific structure with a reactive oligomer as a component forming the film in the material for an insulating film. The present invention has been completed based on the knowledge.

The present invention provides:

(1) A material for an insulating film which comprises, as a component forming the film, a copolymer obtained by reacting a polyamide represented by following general formula [1] with a reactive oligomer having a substituent which can react with carboxyl group, amino group or hydroxyl group in a structure of the polyamide;

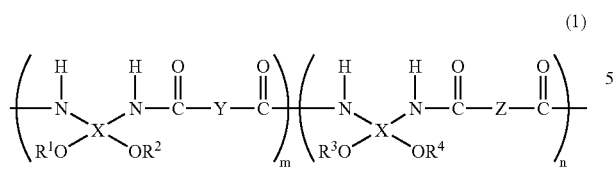

(1)

wherein $R^1$ to $R^4$ each independently represent hydrogen atom or a monovalent organic group, X represents a tetravalent group selected from groups represented by following formulae (A), two groups represented by X may be the same with or different from each other, Y represents at least one divalent group selected from groups represented by following formulae (B), (C), (D) and (E), Z represents a divalent group selected from groups represented by formulae (F), m and n each represent an integer satisfying relations of $m>0$, $n \geq 0$, $2 \leq m+n \leq 1{,}000$ and $0.05 \leq m/(m+n) \leq 1$ and arrangement of repeating units may be a block arrangement or a random arrangement;

Formulae (A)

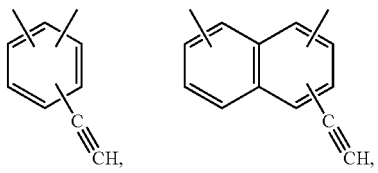

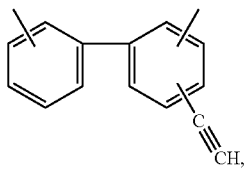

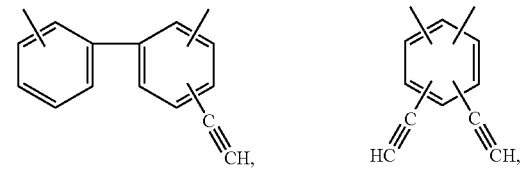

-continued

Formulae (B)-1

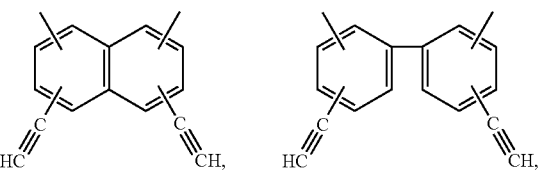

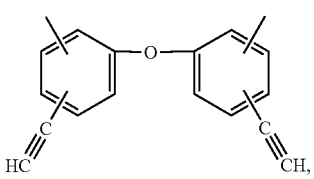

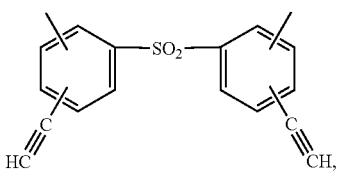

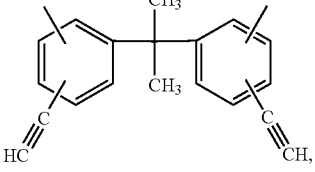

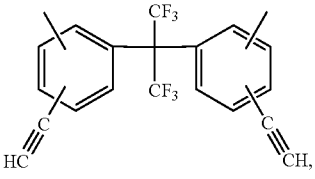

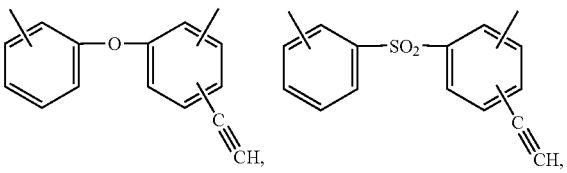

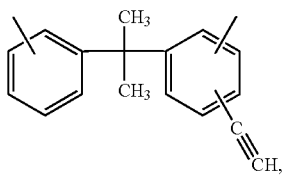

-continued
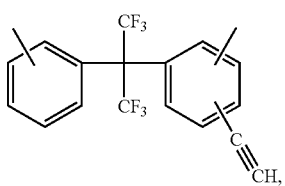
Formulae (B)-2
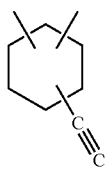 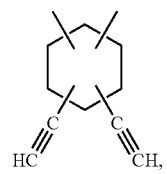
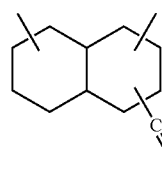 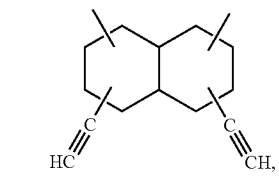
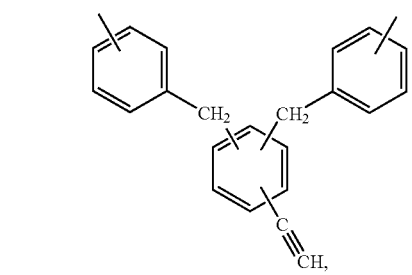
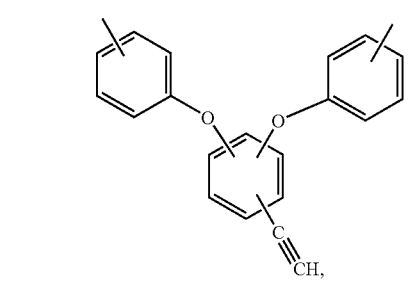
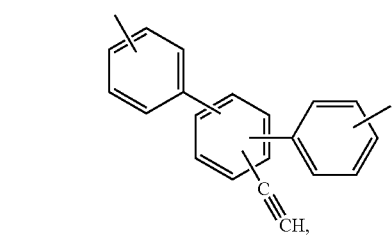
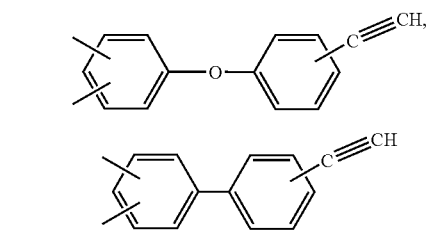
-continued
Formulae (C)-1

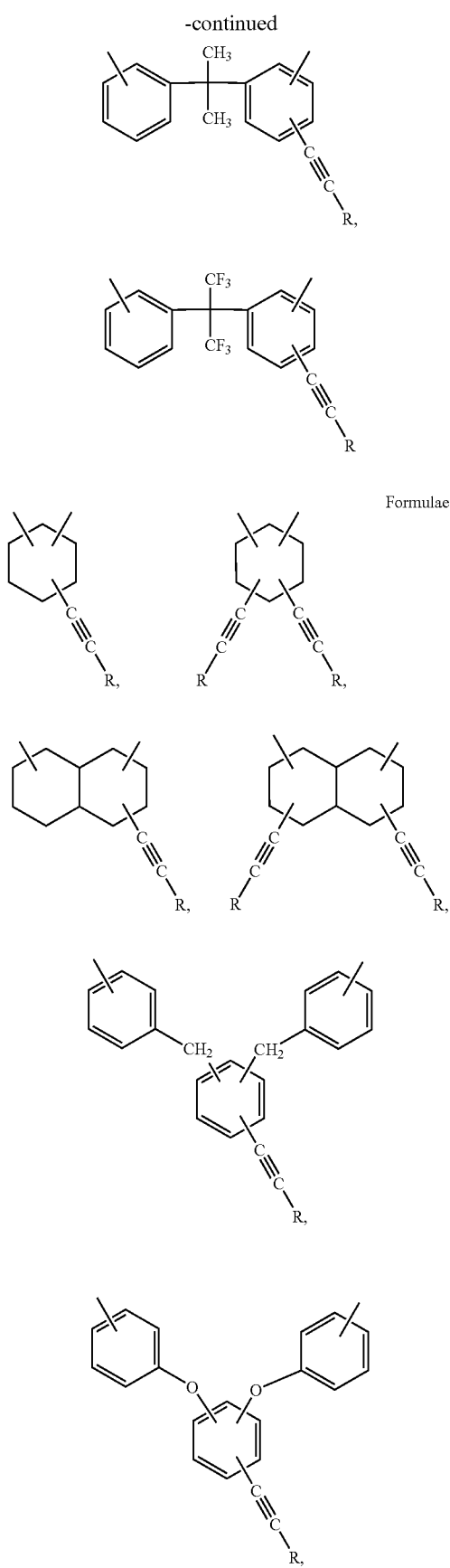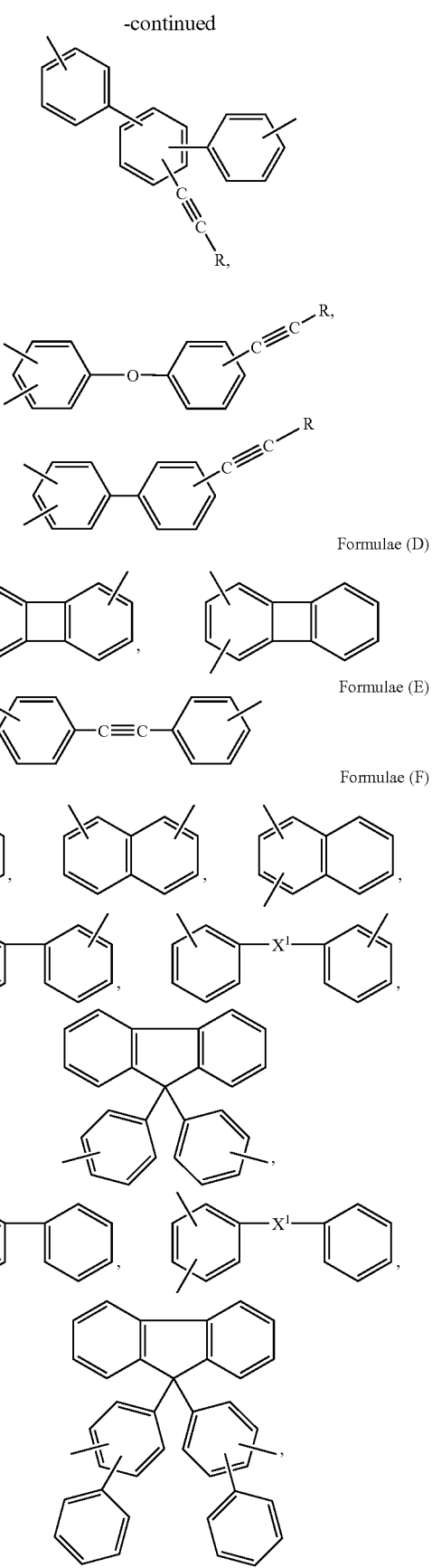

-continued

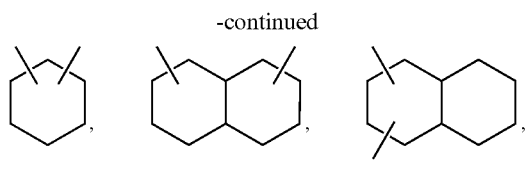

wherein X¹ in formulae (A) and (F) represents a divalent group selected from groups represented by following formulae (G):

Formula (G)

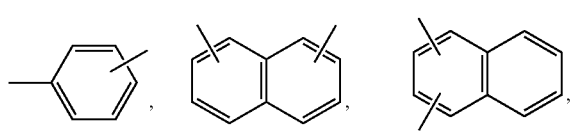

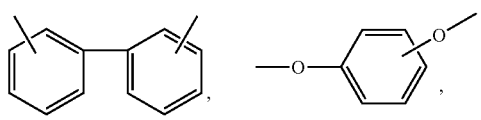

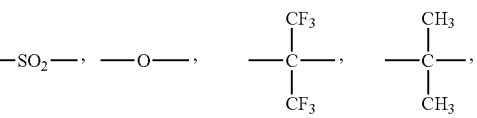

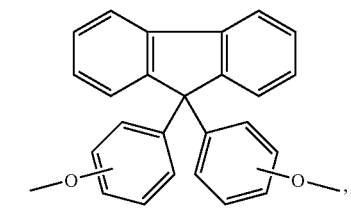

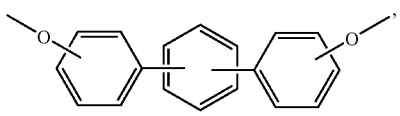

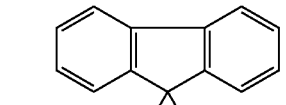

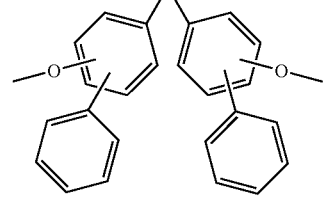

R in formulae (C) represents an alkyl group or a monovalent group selected from groups represented by formulae (H):

Formula (H)

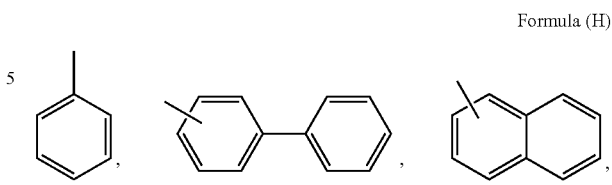

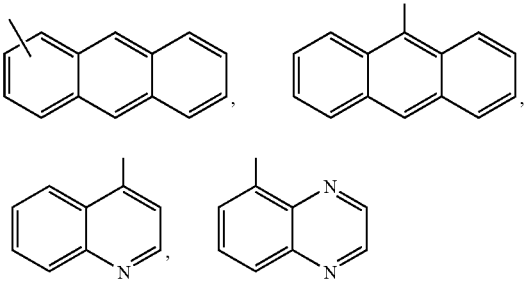

and hydrogen atoms on a benzene ring in groups represented by Formulae (A), (B), (C), (D), (E), (F) and (G) may be substituted with at least one atom or group selected from alkyl groups having 1 to 4 carbon atom, fluorine atom and trifluoromethyl group;

(2) A material for an insulating film described in (1), wherein the polyamide is represented by general formula [1] in which Y represents a divalent group selected from the groups represented by formulae (B);

(3) A material for an insulating film described in (1), wherein the polyamide is represented by general formula [1] in which Y represents a divalent group selected from the groups represented by formulae (C);

(4) A material for an insulating film described in (1), wherein the polyamide is represented by general formula [1] in which Y represents a divalent group selected from the groups represented by formulae (D);

(5) A material for an insulating film described in (1), wherein the polyamide is represented by general formula [1] in which Y represents a divalent group selected from the groups represented by formula (E);

(6) A material for an insulating film described in (1), wherein the reactive oligomer is at least one oligomer selected from polyoxyalkylenes, polymethyl methacrylate, poly-α-methylstyrene, polystyrene, polyesters, polyether esters, polycaprolactone and polyurethanes;

(7) A material for an insulating film described in (1), wherein the reactive oligomer has a number-average molecular weight in a range of 100 to 40,000;

(8) A material for an insulating film described in (7), wherein the reactive oligomer has a number-average molecular weight in a range of 100 to 20,000;

(9) A material for an insulating film described in (8), wherein the reactive oligomer has a number-average molecular weight in a range of 100 to 10,000;

(10) A material for an insulating film described in (1), wherein the copolymer comprises 5 to 70% by weight of a unit of the reactive oligomer;

(11) A material for an insulating film described in (10), wherein the copolymer comprises 5 to 50% by weight of a unit of the reactive oligomer;

(12) A material for an insulating film described in (11), wherein the copolymer comprises 5 to 40% by weight of a unit of the reactive oligomer;

(13) A coating varnish for an insulating film which comprises a material for an insulating film described in (1) and an organic solvent in which the material for an insulating film can be dissolved or dispersed;

(14) An insulating film which comprises a layer of a resin comprising a polybenzoxazole as a main structure and has fine pores, wherein the polybenzoxazole is obtained by treating a material for an insulating film described in (1) or a coating varnish for an insulating film described in (13) by heating so that condensation reaction and crosslinking reaction take place;

(15) An insulating film described in (14), wherein the fine pores in the insulating film have diameters of 1 µm or smaller;

(16) An insulating film described in (15), wherein the fine pores in the insulating film have diameters of 500 nm or smaller;

(17) An insulating film described in (16), wherein the fine pores in the insulating film have diameters of 100 nm or smaller;

(18) An insulating film described in (17), wherein the fine pores in the insulating film have diameters of 20 nm or smaller;

(19) An insulating film according to (14), wherein the insulating films has a fraction of pores of 5 to 70%;

(20) An insulating film described in (19), wherein the insulating films has a fraction of pores of 5 to 50%;

(21) An insulating film described in (20), wherein the insulating films has a fraction of pores of 5 to 40%;

(22) An insulating film described in (14), which is used as an insulating interlayer film for multi-layer wiring in semiconductors;

(23) An insulating film described in (14), which is used as a surface protective film of semiconductors; and

(24) A semiconductor device which comprises at least one of an insulating interlayer film for multi-layer wiring comprising an insulating film which is described in (22) and a surface protective film comprising an insulating film which is described in (23).

DESCRIPTION OF THE PREFERRED EMBODIMENTS

The material for an insulating film of the present invention comprises a copolymer obtained by reacting a polyamide and a reactive oligomer as the component forming the film. At least one skeleton structure which can be crosslinked by heating is selected from the ethynyl skeleton structure, the phenylethynyl skeleton structure, the alkylethynyl skeleton structures, the biphenylene skeleton structure and the inner acetylene skeleton structure and is introduced into the main chain of the polyamide unit in the copolymer. Then, the amide group in the main chain is converted into a polybenzoxazole structure by ring closure and, at the same time, the structure of the resin is converted into a three-dimensional structure by the crosslinking reaction of the skeleton structure selected from the ethynyl skeleton structure, the phenylethynyl skeleton structure, the alkylethynyl skeleton structures, the biphenylene skeleton structure and the inner acetylene skeleton structure. Thus, a resin having excellent heat resistance can be provided. The unit of the oligomer in the copolymer is decomposed and the products of the decomposition are vaporized in the step of heating the resin. Fine pores are formed in the film of the resin comprising the polybenzoxazole as the main structure and the permittivity is decreased. A porous insulating film which exhibits both of excellent heat resistance and excellent electrical properties is obtained. The essential portion of the present invention can be summarized as described above.

The polyamide which constitutes the polyamide unit in the copolymer in the material for an insulating film of the present invention has a structure represented by general formula [1] described above. The polyamide can be obtained from at least one bisaminophenol compound having a tetravalent group selected from the groups represented by formulae (A) and at least one dicarboxylic acid having a group selected from the divalent groups represented by formulae (B), (C), (D) and (E) in accordance with a conventional process such as the acid chloride process, the activated ester process and the condensation reaction in the presence of an agent for condensation with elimination of water such as polyphosphoric acid and dicyclohexylcarbodiimide. A combination of the above dicarboxylic acid and a dicarboxylic acid having a divalent group selected from the groups represented by formulae (F) may be used as the dicarboxylic acid.

A highly heat resistant resin can also be obtained by forming an interpenetrating network from a combination of a polyamide comprising at least one skeleton structure selected from the ethynyl structure, the phenylethynyl structure, the alkylethynyl structures, the biphenylene structure and the internal acetylene structure and a conventional polyamide without crosslinking groups, i.e., without the crosslinking reactivity.

A polyamide which does not have the ethynyl skeleton structure, the phenylethynyl skeleton structure, the alkylethynyl skeleton structures, the biphenylene skeleton structure or the internal acetylene skeleton structure can be obtained from at least one bisaminophenol compound having a tetravalent group selected from the groups represented by formulae (A) and at least one dicarboxylic acid having a divalent group selected from the groups represented by formulae (F) in accordance with the same process as that described above.

Examples of the bisaminophenol compound having a tetravalent group selected from the groups represented by formulae (A) include 2,4-diaminoresorcinol, 4,6-diaminoresorcinol, 2,2-bis(3-amino-4-hydroxyphenyl)hexafluoropropane, 2,2-bis(4-amino-3-hydroxyphenyl)hexafluoropropane, 2,2-bis(3-amino-4-hydroxyphenyl)propane, 2,2-bis(4-amino-3-hydroxyphenyl)propane, 3,3'-diamino-4,4'-dihydroxydiphenylsulfone, 4,4'-diamino-3,3'-dihydroxydiphenylsulfone, 3,3'-diamino-4,4'-dihydroxybiphenyl, 4,4'-diamino-3,3'-dihydroxybiphenyl, 9,9-bis(4-((4-amino-3-hydroxy)phenoxy)phenyl)fluorene, 9,9-bis(4-((3-amino-4-hydroxy)-phenoxy)phenyl)fluorene, 9,9-bis((4-amino-3-hydroxy)phenyl)fluorene, 9,9-bis((3-amino-4-hydroxy)phenyl)fluorene, 3,3'-diamino-4,4'-dihydroxydiphenyl ether, 4,4'-diamino-3,3'-dihydroxydiphenyl ether, 2,2-bis(3-amino-4-hydroxy-2-trifluoromethylphenyl)propane, 2,2-bis(4-amino-3-hydroxy-2-trifluoromethylphenyl)propane, 2,2-bis(3-amino-4-hydroxy-5-trifluoromethylphenyl)propane, 2,2-bis(4-amino-3-hydroxy-5-trifluoromethylphenyl)propane, 2,2-bis(3-amino-4-hydroxy-6-trifluoromethylphenyl)propane, 2,2-bis(4-amino-3-hydroxy-6-trifluoromethylphenyl)propane, 2,2-bis(3-amino-4-hydroxy-2-trifluoromethylphenyl) hexafluoropropane, 2,2-bis(4-amino-3-hydroxy-2-trifluoromethylphenyl)hexafluoropropane, 2,2-bis(3-amino-4-hydroxy-5-trifluoromethylphenyl)hexafluoropropane, 2,2- bis(4-amino-3-hydroxy-5-trifluoromethylphenyl)hexafluoropropane, 2,2-bis(3-amino-4-hydroxy-6-trifluoromethylphenyl)hexafluoropropane, 2,2-bis(4-amino-3-hydroxy-6-trifluoromethylphenyl)hexafluoropropane, 3,3'-diamino-4,4'-dihydroxy-2,2'-bis(trifluoromethyl)biphenyl, 4,4'-diamino-3,3'-dihydroxy-2,2'-bis(trifluoromethyl)biphenyl, 3,3'-diamino-4,4'-dihydroxy-5,5'-bis(trifluoromethyl)biphenyl, 4,4'-diamino-3,3'-dihydroxy-5,5'-bis(trifluoromethyl)biphenyl, 3,3'-diamino-4,4'-dihydroxy-6,6'-bis(trifluoromethyl)biphenyl, 4,4'-diamino-3,3'-dihydroxy-6,6'-bis(trifluoromethyl)biphenyl, 9,9-bis(4-((4-amino-3-hydroxy)phenoxy)-3-phenylphenyl)fluorene, 9,9-bis(4-((3-amino-4-hydroxy)phenoxy)-3-phenylphenyl)fluorene, 9,9-bis((2-amino-3-hydroxy-4-phenyl)phenyl)fluorene, 9,9-bis((2-hydroxy-3-amino-4-phenyl)phenyl)fluorene, The above compounds may be used singly or in combination of two or more.

Examples of the dicarboxylic acid having the ethynyl skeleton structure having a divalent group selected from the groups represented by formulae (B), which is used in the present invention, include 3-ethynylphthalic acid, 4-ethynylphthalic acid, 2-ethynylisophthalic acid, 4-ethynylisophthalic acid, 5-ethynylisophthalic acid, 2-ethynylterephthalic acid, 3-ethynylterephthalic acid, 5-ethynylterephthalic acid, 2-ethynyl-1,5-naphthalenedicarboxylic acid, 3-ethynyl-1,5-naphthalenedicarboxylic acid, 4-ethynyl-1,5-naphthalenedicarboxylic acid, 1-ethynyl-2,6-naphthalenedicarboxylic acid, 3-ethynyl-2,6-naphthalenedicarboxylic acid, 4-ethynyl-2,6-naphthalenedicarboxylic acid, 2-ethynyl-1,6-naphthalenedicarboxylic acid, 3-ethynyl-1,6-naphthalenedicarboxylic acid, 4-ethynyl-1,6-naphthalenedicarboxylic acid, 5-ethynyl-1,6-naphthalenedicarboxylic acid, 7-ethynyl-1,6-naphthalenedicarboxylic acid, 8-ethynyl-1,6-naphthalenedicarboxylic acid, 3,3'-diethynyl-2,2'-biphenyldicarboxylic acid, 4,4'-diethynyl-2,2'-biphenyldicarboxylic acid, 5,5'-diethynyl-2,2'-biphenyldicarboxylic acid, 6,6'-diethynyl-2,2'-biphenyldicarboxylic acid, 2,2'-diethynyl-3,3'-biphenyldicarboxylic acid, 4,4'-diethynyl-3,3'-biphenyldicarboxylic acid, 5,5'-diethynyl-3,3'-biphenyldicarboxylic acid, 6,6'-diethynyl-3,3'-biphenyldicarboxylic acid, 2,2'-diethynyl-4,4'-biphenyldicarboxylic acid, 3,3'-diethynyl-4,4'-biphenyldicarboxylic acid, 2,2-bis(2-carboxy-3-ethynylphenyl)propane, 2,2-bis(2-carboxy-4-ethynylphenyl)propane, 2,2-bis(2-carboxy-5-ethynylphenyl)propane, 2,2-bis(2-carboxy-6-ethynylphenyl)propane, 2,2-bis(3-carboxy-2-ethynylphenyl)propane, 2,2-bis(3-carboxy-4-ethynylphenyl)propane, 2,2-bis(3-carboxy-5-ethynylphenyl)propane, 2,2-bis(3-carboxy-6-ethynylphenyl)propane, 2,2-bis(4-carboxy-2-ethynylphenyl)propane, 2,2-bis(4-carboxy-3-ethynylphenyl)propane, 2,2-bis(2-carboxy-4-ethynylphenyl)hexafluoropropane, 2,2-bis(3-carboxy-5-ethynylphenyl)hexafluoropropane, 2,2-bis(4-carboxy-2-ethynylphenyl)hexafluoropropane, 2,2-bis(4-carboxy-2-ethynylphenyl)hexafluoropropane, 4-ethynyl-1,3-dicarboxycyclopropane, 5-ethynyl-2,2-dicarboxycyclopropane, structural isomers of 1,3-bis(4-carboxyphenoxy)-5-ethynylbenzene, structural isomers of 1,3-bis(4-carboxyphenyl)-5-ethynylbenzene, 5-(3-ethynylphenoxy)isophthalic acid, 5-(1-ethynylphenoxy)isophthalic acid, 5-(2-ethynylphenoxy)isophthalic acid, 2-(1-ethynylphenoxy)terephthalic acid, 2-(2-ethynylphenoxy)terephthalic acid, 2-(3-ethynylphenoxy)terephthalic acid, 5-(1-ethynylphenyl)-isophthalic acid, 5-(2-ethynylphenyl)isophthalic acid, 5-(3-ethynylphenyl)-isophthalic acid, 2-(1-ethynylphenyl)terephthalic acid, 2-(2-ethynylphenyl)terephthalic acid and 2-(3-ethynylphenyl)terephthalic acid.

However the dicarboxylic acid is not limited to the compounds described as the examples. The above compound may be used singly or in combination of two or more. The above compounds may be used in combination with two or more bisaminophenol compounds.

Examples of the dicarboxylic acid having a divalent group selected from the groups represented by formulae (C), which is used in the present invention, include 3-phenylethynylphthalic acid, 4-phenylethynylphthalic acid, 2-phenylethynylisophthalic acid, 4-phenylethynylisophthalic acid, 5-phenylethynylisophthalic acid, 2-phenylethynylterephthalic acid, 3-phenylethynylterephthalic acid, 2-phenylethynyl-1,5-naphthalenedicarboxylic acid, 3-phenylethynyl-1,5-naphthalenedicarboxylic acid, 4-phenylethynyl-1,5-naphthalenedicarboxylic acid, 1-phenylethynyl-2,6-naphthalenedicarboxylic acid, 3-phenylethynyl-2,6-naphthalenedicarboxylic acid, 4-phenylethynyl-2,6-naphthalenedicarboxylic acid, 2-phenylethynyl-1,6-naphthalenedicarboxylic acid, 3-phenylethynyl-1,6-naphthalenedicarboxylic acid, 4-phenylethynyl-1,6-naphthalenedicarboxylic acid, 5-phenylethynyl-1,6-naphthalenedicarboxylic acid, 7-phenylethynyl-1,6-naphthalenedicarboxylic acid, 8-phenylethynyl-1,6-naphthalenedicarboxylic acid, 3,3'-diphenylethynyl-2,2'-biphenyldicarboxylic acid, 4,4'-diphenylethynyl-2,2'-biphenyldicarboxylic acid, 5,5'-diphenylethynyl-2,2'-biphenyldicarboxylic acid, 6,6'-diphenylethynyl-2,2'-biphenyldicarboxylic acid, 2,2'-diphenylethynyl-3,3'-biphenyldicarboxylic acid, 4,4'-diphenylethynyl-3,3'-biphenyldicarboxylic acid, 5,5'-diphenylethynyl-3,3'-biphenyldicarboxylic acid, 6,6'-diphenylethynyl-3,3'-biphenyldicarboxylic acid, 2,2'-diphenylethynyl-4,4'-biphenyldicarboxylic acid, 3,3'-diphenylethynyl-4,4'-biphenyldicarboxylic acid, 2,2-bis(2-carboxy-3-phenylethynylphenyl)propane, 2,2-bis(2-carboxy-4-phenylethynylphenyl)propane, 2,2-bis(2-carboxy-5-phenylethynylphenyl)propane, 2,2-bis(2-carboxy-6-phenylethynylphenyl)propane, 2,2-bis(3-carboxy-2-phenylethynylphenyl)propane, 2,2-bis(3-carboxy-4-phenylethynylphenyl)propane, 2,2-bis(3-carboxy-5-phenylethynylphenyl)propane, 2,2-bis(3-carboxy-6-phenylethynylphenyl)propane, 2,2-bis(4-carboxy-2-phenylethynylphenyl)propane, 2,2-bis(4-carboxy-3-phenylethynylphenyl)propane, 2,2-bis(2-carboxy-4-phenylethynylphenyl)hexafluoropropane, 2,2-bis(3-carboxy-5-phenylethynylphenyl)hexafluoropropane, 2,2-bis(4-carboxy-2-phenylethynylphenyl)hexafluoropropane, 4-phenylethynyl-1,3-dicarboxycyclopropane, 5-phenylethynyl-2,2-dicarboxycyclopropane, structural isomers of 1,3-bis(4-carboxyphenoxy)-5-phenylethynylbenzene, structural isomers of 1,3-bis(4-carboxyphenyl)-5-phenylethynylbenzene, 5-(1-phenylethynylphenoxy)isophthalic acid, 5-(2-phenylethynylphenoxy)isophthalic acid, 5-(3-phenylethynylphenoxy)isophthalic acid, 2-(1-phenylethynylphenoxy)terephthalic acid, 2-(2-phenylethynylphenoxy)terephthalic acid, 2-(3-phenylethynylphenoxy)terephthalic acid, 5-(1-phenylethynylphenyl)isophthalic acid, 5-(2-phenylethynylphenyl)isophthalic acid, 5-(3-phenylethynylphenyl)isophthalic acid, 2-(1-phenylethynylphenyl)terephthalic acid, 2-(2-phenylethynylphenyl)terephthalic acid and 2-(3-phenylethynylphenyl)terephthalic acid.

Example of the dicarboxylic acid having biphenylethynyl group used in the present invention, which is the dicarboxylic acid having a group selected from the groups represented by formulae (C) in which R represents biphenyl group among the monovalent groups represented by formulae (H), include 3-biphenylethynylphthalic acid, 4-biphenylethynylphthalic acid, 2-biphenylethynylisophthalic acid, 4-biphenylethynylisophthalic acid, 5-biphenylethynylisophthalic acid, 2-biphenylethynylterephthalic acid, 3-biphenylethynylterephthalic acid, 5-biphenylethynylterephthalic acid, 2-biphenylethynyl-1,5-naphthalenedicarboxylic acid, 3-biphenylethynyl-1,5-naphthalenedicarboxylic acid, 4-biphenylethynyl-1,5-naphthalenedicarboxylic acid, 1-biphenylethynyl-2,6-naphthalenedicarboxylic acid, 3-biphenylethynyl-2,6-naphthalenedicarboxylic acid, 4-biphenylethynyl-2,6-naphthalenedicarboxylic acid, 2-biphenylethynyl-1,6-naphthalenedicarboxylic acid, 3-biphenylethynyl-1,6-naphthalenedicarboxylic acid, 4-biphenylethynyl-1,6-naphthalenedicarboxylic acid, 5-biphenylethynyl-1,6-naphthalenedicarboxylic acid, 7-biphenylethynyl-1,6-naphthalenedicarboxylic acid, 8-biphenylethynyl-1,6-naphthalenedicarboxylic acid, 3,3'-dibiphenylethynyl-2,2'-biphenyldicarboxylic acid, 4,4'-dibiphenylethynyl-2,2'-biphenyldicarboxylic acid, 5,5'-dibiphenylethynyl-2,2'-biphenyldicarboxylic acid, 6,6'-dibiphenylethynyl-2,2'-biphenyldicarboxylic acid, 2,2'-dibiphenylethynyl-3,3'-biphenyldicarboxylic acid, 4,4'-dibiphenylethynyl-3,3'-biphenyldicarboxylic acid, 5,5'-dibiphenylethynyl-3,3'-biphenyldicarboxylic acid, 6,6'-dibiphenylethynyl-3,3'-biphenyldicarboxylic acid, 2,2'-dibiphenylethynyl-4,4'-biphenyldicarboxylic acid, 3,3'-dibiphenylethynyl-4,4'-biphenyldicarboxylic acid, 2,2-bis(2-carboxy-3-biphenylethynylphenyl)propane, 2,2-bis(2-carboxy-4-biphenylethynylphenyl)propane, 2,2-bis(2-carboxy-5-biphenylethynylphenyl)propane, 2,2-bis(2-carboxy-6-biphenylethynylphenyl)propane, 2,2-bis(3-carboxy-2-biphenylethynylphenyl)propane, 2,2-bis(3-carboxy-4-biphenylethynylphenyl)propane, 2,2-bis(3-carboxy-5-biphenylethynylphenyl)propane, 2,2-bis(3-carboxy-6-biphenylethynylphenyl)propane, 2,2-bis(4-carboxy-2-biphenylethynylphenyl)propane, 2,2-bis(4-carboxy-3-biphenylethynylphenyl)propane, 2,2-bis(2-carboxy-4-biphenylethynylphenyl)hexafluoropropane, 2,2-bis(3-carboxy-5-biphenylethynylphenyl)hexafluoropropane, 2,2-bis(4-carboxy-2-biphenylethynylphenyl)hexafluoropropane, 4-biphenylethynyl-1,3-dicarboxycyclopropane, 5-biphenylethynyl-2,2-dicarboxycyclopropane, structural isomers of 1,3-bis(4-carboxyphenoxy)-5-biphenylethynylbenzene, structural isomers of 1,3-bis(4-carboxyphenyl)-5-biphenylethynylbenzene, 5-(3-biphenylethynylphenoxy)isophthalic acid, 5-(1-biphenylethynylphenoxy)isophthalic acid, 5-(2-biphenylethynylphenoxy)isophthalic acid, 2-(1-biphenylethynylphenoxy)terephthalic acid, 2-(2-biphenylethynylphenoxy)terephthalic acid, 2-(3-biphenylethynylphenoxy)terephthalic acid, 5-(1-biphenylethynylphenyl)isophthalic acid, 5-(2-biphenylethynylphenyl)isophthalic acid, 5-(3-biphenylethynylphenyl)isophthalic acid, 2-(1-biphenylethynylphenyl)terephthalic acid, 2-(2-biphenylethynylphenyl)terephthalic acid and 2-(3-biphenylethynylphenyl)terephthalic acid. However, the dicarboxylic acid is not limited to the compounds described as the examples. The above compounds may be used singly or in combination of two or more. The above compounds may be used in combination with two or more bisaminophenol compounds.

Examples of the dicarboxylic acid having a group selected from the groups represented by formulae (C) in which R represents an alkyl group include 3-hexynylphthalic acid, 4-hexynylphthalic acid, 2-hexynylisophthalic acid, 4-hexynylisophthalic acid, 5-hexynylisophthalic acid, 2-hexynylterephthalic acid, 3-hexynylterephthalic acid, 2-hexynyl-1,5-naphthalenedicarboxylic acid, 3-hexynyl-1,5-naphthalenedicarboxylic acid, 4-hexynyl-1,5-naphthalenedicarboxylic acid, 1-hexynyl-2,6-naphthalenedicarboxylic acid, 3-hexynyl-2,6-naphthalenedicarboxylic acid, 4-hexynyl-2,6-naphthalenedicarboxylic acid, 2-hexynyl-1,6-naphthalenedicarboxylic acid, 3-hexynyl-1,6-naphthalenedicarboxylic acid, 4-hexynyl-1,6-naphthalenedicarboxylic acid, 5-hexynyl-1,6-naphthalenedicarboxylic acid, 7-hexynyl-1,6-naphthalenedicarboxylic acid, 8-hexynyl-1,6-naphthalenedicarboxylic acid, 3,3'-dihexynyl-2,2'-biphenyldicarboxylic acid, 4,4'-dihexynyl-2,2'-biphenyldicarboxylic acid, 5,5'-dihexynyl-2,2'-biphenyldicarboxylic acid, 6,6'-dihexynyl-2,2'-biphenyldicarboxylic acid, 2,2'-dihexynyl-3,3'-biphenyldicarboxylic acid, 4,4'-dihexynyl-3,3'-biphenyldicarboxylic acid, 5,5'-dihexynyl-3,3'-biphenyldicarboxylic acid, 6,6'-dihexynyl-3,3'-biphenyldicarboxylic acid, 2,2'-dihexynyl-4,4'-biphenyldicarboxylic acid, 3,3'-dihexynyl-4,4'-biphenyldicarboxylic acid, 2,2-bis(2-carboxy-3-hexynylphenyl)propane, 2,2-bis(2-carboxy-4-hexynylphenyl)propane, 2,2-bis(2-carboxy-5-hexynylphenyl)propane, 2,2-bis(2-carboxy-6-hexynylphenyl)propane, 2,2-bis(3-carboxy-2-hexynylphenyl)propane, 2,2-bis(3-carboxy-4-hexynylphenyl)propane, 2,2-bis(3-carboxy-5-hexynylphenyl)propane, 2,2-bis(3-carboxy-6-hexynylphenyl)propane, 2,2-bis(4-carboxy-2-hexynylphenyl)propane, 2,2-bis(4-carboxy-3-hexynylphenyl)propane, 2,2-bis(2-carboxy-4-hexynylphenyl)hexafluoropropane, 2,2-bis(3-carboxy-5-hexynylphenyl)hexafluoropropane, 2,2-bis(4-carboxy-2-hexynylphenyl)hexafluoropropane, 4-hexynyl-1,3-dicarboxycyclopropane, 5-hexynyl-2,2-dicarboxycyclopropane, structural isomers of 1,3-bis(4-carboxyphenoxy)-5-hexynylbenzene, structural isomers of 1,3-bis(4-carboxyphenyl)-5-hexynylbenzene, 5-(3-hexynylphenoxy)isophthalic acid, 5-(1-hexynylphenoxy)isophthalic acid, 5-(2-hexynylphenoxy)isophthalic acid, 2-(1-hexynylphenoxy)terephthalic acid, 2-(2-hexynylphenoxy)terephthalic acid, 2-(3-hexynylphenoxy)terephthalic acid, 5-(1-hexynylphenyl)isophthalic acid, 5-(2-hexynylphenyl)isophthalic acid, 5-(3-hexynylphenyl)isophthalic acid, 2-(1-hexynylphenyl)terephthalic acid, 2-(2-hexynylphenyl)terephthalic acid and 2-(3-hexynylphenyl)terephthalic acid. However, the dicarboxylic acid is not limited to the compounds described as the examples. The above compounds may be used singly or in combination of two or more. The above compounds may be used in combination with two or more bisaminophenol compounds.

Examples of the dicarboxylic acid having the biphenylene skeleton structure used in the present invention, which is the compound having a divalent group selected from the groups represented by formulae (D), include 1,2-biphenylenedicarboxylic acid, 1,3-biphenylenedicarboxylic acid, 1,4-biphenylenedicarboxylic acid, 1,5-biphenylenedicarboxylic acid, 1,6-biphenylenedicarboxylic acid, 1,7-biphenylenedicarboxylic acid, 1,8-biphenylenedicarboxylic acid, 2,3-biphenylenedicarboxylic acid, 2,6-biphenylenedicarboxylic acid and 2,7-biphenylenedicarboxylic acid. From the standpoint of the properties of the obtained coating film, 2,6-biphenylenedicarboxylic acid and 2,7-biphenylenedicarboxylic acid are preferable. The above compounds may be used singly or in combination of two or more.

Examples of the dicarboxylic acid having a divalent group represented by formula (E), which is used in the present invention, include 4,4'-tolandicarboxylic acid, 3,4'-tolandicarboxylic acid, 3,3'-tolandicarboxylic acid, 2,4'-tolandicarboxylic acid, 2,3'-tolandicarboxylic acid and 2,2'-tolandicarboxylic acid. The above compounds may be used singly or in combination of two or more.

Examples of the dicarboxylic acid having a divalent group selected from the groups represented by formulae (F), which is used in the present invention, include isophthalic acid, terephthalic acid, 4,4'-biphenyldicarboxylic acid, 3,4'-biphenyldicarboxylic acid, 3,3'-biphenyldicarboxylic acid, 1,4-naphthalenedicarboxylic acid, 2,3-naphthalenedicarboxylic acid, 2,6-naphthalenedicarboxylic acid, 4,4'-sulfonylbisbenzoic acid, 3,4'-sulfonylbisbenzoic acid, 3,3'-sulfonylbisbenzoic acid, 4,4'-oxybisbenzoic acid, 3,4'-oxybisbenzoic acid, 3,3'-oxybisbenzoic acid, 2,2-bis(4-carboxyphenyl)propane, 2,2-bis(3-carboxyphenyl)propane, 2,2-bis(4-carboxyphenyl)hexafluoropropane, 2,2-bis(3-carboxyphenyl)hexafluoropropane, 2,2'-dimethyl-4,4'-biphenyldicarboxylic acid, 3,3'-dimethyl-4,4'-biphenyldicarboxylic acid, 2,2'-dimethyl-3,3'-biphenyldicarboxylic acid, 2,2'-bis(trifluoromethyl)-4,4'-biphenyldicarboxylic acid, 3,3'-bis(trifluoromethyl)-4,4'-biphenyldicarboxylic acid, 2,2'-bis(trifluoromethyl)-3,3'-biphenyldicarboxylic acid, 9,9-bis(4-(4-carboxyphenoxy)phenyl)fluorene, 9,9-bis(4-(3-carboxyphenoxy)phenyl)fluorene, 4,4'-bis(4-carboxyphenoxy)biphenyl, 4,4'-bis(3-carboxyphenoxy)biphenyl, 3,4'-bis(4-carboxyphenoxy)biphenyl, 3,4'-bis(3-carboxyphenoxy)biphenyl, 3,3'-bis(4-carboxyphenoxy)biphenyl, 3,3'-bis(3-carboxyphenoxy)biphenyl, 4,4'-bis(4-carboxyphenoxy)-p-terphenyl, 4,4'-bis(4-carboxyphenoxy)-m-terphenyl, 3,4'-bis(4-carboxyphenoxy)-p-terphenyl, 3,3'-bis(4-carboxyphenoxy)-p-terphenyl, 3,4'-bis(4-carboxyphenoxy)-m-terphenyl, 3,3'-bis(4-carboxyphenoxy)-m-terphenyl, 4,4'-bis(3-carboxyphenoxy)-p-terphenyl, 4,4'-bis(3-carboxyphenoxy)-m-terphenyl, 3,4'-bis(3-carboxyphenoxy)-p-terphenyl, 3,3'-bis(3-carboxyphenoxy)-p-terphenyl, 3,4'-bis(3-carboxyphenoxy)-m-terphenyl, 3,3'-bis(3-carboxyphenoxy)-m-terphenyl, 3-fluoroisophthalic acid, 2-fluoroisophthalic acid, 2-fluoroterephthalic acid, 2,4,5,6-tetrafluoroisophthalic acid, 2,3,5,6-tetrafluoroterephthalic acid, 5-trifluoromethylisophthalic acid, 9,9-bis(2-carboxyphenyl)fluorene, 9,9-bis(3-carboxyphenyl)fluorene, 9,9-bis(4-carboxyphenyl)fluorene, bis((2-carboxy-3-phenyl)phenyl)fluorene, bis((4-carboxy-3-phenyl)phenyl)fluorene, bis((5-carboxy-3-phenyl)phenyl)fluorene, bis((6-carboxy-3-phenyl)phenyl)fluorene, 9,9-bis(4-(2-carboxyphenoxy)phenyl)fluorene, 9,9-bis(4-(3-carboxyphenoxy)phenyl)fluorene, 9,9-bis(4-(4-carboxyphenoxy)phenyl)fluorene, 9,9-bis((4-(2-carboxyphenoxy)-3-phenyl)phenyl)fluorene, 9,9-bis((4-(3-carboxyphenoxy)-3-phenyl)phenyl)fluorene and 9,9-bis((4-(4-carboxyphenoxy)-3-phenyl)phenyl)fluorene. The above compounds may be used singly or in combination of two or more.

The hydrogen atoms on the benzene ring in the groups represented by general formulae (A), (B), (C), (D), (E), (F) and (G) may be substituted with at least one atom or group selected from alkyl groups having 1 to 4 carbon atoms, fluorine atom and trifluoromethyl group. Examples of the alkyl group having 1 to 4 carbon atoms include methyl group, ethyl group, propyl group, isopropyl group, butyl group, isobutyl group and t-butyl group.

In the present invention, m and n in general formula [1] representing the polyamide represent the number of the repeating unit having the crosslinking skeleton structure and the number of the repeating unit having no crosslinking skeleton structure, receptively. The integers represented by m and n satisfy the following relations: $m>0$, $n \geq 0$, $2 \leq m+n \leq 1,000$ and $0.05 \leq m/(m+n) \leq 1$. It is preferable that the sum of m and n is 5 or greater and 100 or smaller. When the sum of m and n is smaller than 2, the property for forming a film deteriorates and the mechanical strength of the resin film becomes insufficient. When the sum of m and n is greater than 1000, solubility of the polyamide in solvents decreases. Even when the polyamide is dissolved in a solvent, a viscous varnish is formed and not suitable for practical use. It is essential that the integers represented by m and n satisfy the relation: $0.05 \leq m/(m+n) \leq 1$. It is preferable that the integers represented by m and n satisfy the relation: $0.5 \leq m/(m+n) \leq 1$. The relation expressed by $0.05 > m/(m+n)$ means that the number of the repeating unit having the crosslinking skeleton structure is small and the heat resistance is not improved since the number of the portion for crosslinking is small. Such a relation is not preferable since the fine pores cannot be maintained or uneven fine pores are formed.

In the structure represented by general formula [1], the repeating units may be arranged in a block arrangement or in a random arrangement. The structure having the repeating units arranged in a block arrangement can be produced, for example, in accordance with the following acid chloride process. A bisaminophenol compound having a tetravalent group selected from the groups represented by formulae (A) and a chloride of a dicarboxylic acid having a divalent group selected from the groups represented by formulae (F) are reacted in advance and the molecular weight is raised. Then, the bisaminophenol compound having a tetravalent group selected from the groups represented by formulae (A) and a chloride of a dicarboxylic acid having a structure contributing to crosslinking which is selected from the divalent groups represented by formulae (B), (C), (D) and (E) are reacted.

The order in the above reactions may be reversed. A bisaminophenol compound having a tetravalent group selected from the groups represented by formulae (A) and a chloride of a dicarboxylic acid having a structure contributing to crosslinking which is selected from the divalent groups represented by formulae (B), (C), (D) and (E) may be reacted in advance and the molecular weight is raised. Then, the bisaminophenol compound having a tetravalent group selected from the groups represented by formulae (A) and a chloride of a dicarboxylic acid having a divalent group selected from the groups represented by formulae (F) may be reacted.

The structure having the repeating units arranged in a random arrangement can be produced by simultaneously reacting a bisaminophenol compound having a tetravalent group selected from the groups represented by formulae (A), a chloride of a dicarboxylic acid having a structure contributing to crosslinking which is selected from the divalent groups represented by formulae (B), (C), (D) and (E) and a chloride of a dicarboxylic acid having a divalent group selected from the groups represented by formulae (F).

The reactive oligomer used for the reaction with the polyamide in the present invention has in the structure thereof a reactive substituent which can react with carboxyl group, amino group or hydroxyl group in the polyamide structure. It is essential that the oligomer has carboxyl group, amino group or hydroxyl group as the reactive substituent. It is also necessary that the oligomer be decomposed at a temperature lower than the heat decomposition temperature of the polyamide and the products of the decomposition be vaporized.

Examples of the reactive oligomer include polyoxyalkylenes such as polyoxymethylene, polyoxyethylene, polyoxymethylene-oxyethylene copolymers, polyoxymethylene-oxypropylene copolymers, polyoxyethylene-oxypropylene copolymers and polytetrahydrofuran, polymethyl methacrylate, polyurethanes, poly-α-methylstyrene, polystyrene, polyesters, polyether esters and polycaprolactone. The reactive oligomer may be used singly or in combination of two or more.

As the reactive oligomer, oligomers having reactive substituents introduced into side chains or one or both ends of the main chain can also be used. Reactive oligomers modified at the ends of the main chain are industrially easily available. Specific examples of such an oligomer include styrene oligomers modified with 4-aminobenzoic acid ester group at the chain end, poly(propylene glycol) oligomers modified with 4-aminobenzoic acid ester group at the chain end, poly(ethylene glycol)-block-poly(propylene glycol)-block-(polyethylene glycol) modified with hydroxyl group at both chain ends and poly(propylene glycol)bis(2-aminopropyl ether).

It is preferable that the reactive oligomer has a number-average molecular weight in the range of 100 to 40,000, more preferably in the range of 100 to 20,000 and most preferably in the range of 100 to 10,000. When the number-average molecular weight is smaller than 100, pores formed after decomposition and vaporization of the copolymer are small and tend to collapse and it is difficult that a decreased permittivity is exhibited. When the number-average molecular weight exceeds 40,000, pores are exceedingly large and there is the possibility that the insulating film cannot be used practically due to extreme deterioration in the mechanical properties of the insulating film.

In the present invention, it is preferable that the amount of the unit of the above reactive oligomer introduced into the copolymer is in the range of 5 to 70% by weight, more preferably in the range of 5 to 50% by weight and most preferably in the range of 5 to 40% by weight. When the amount of the introduced reactive oligomer is smaller than 5% by weight, the fraction of pores in the insulating film is small and insufficient for decreasing the permittivity. When the amount of the introduced reactive oligomer exceeds 70% by weight, the fraction of pores in the insulating film is great and problems arise in that the mechanical properties of the film extremely deteriorate and that pores are formed continuously and unevenly and the permittivity is different from portion to portion.

Therefore, when the polyamide and the reactive oligomer are reacted with each other, it is important that the amounts of the components are adjusted so that the amount of the unit of the reactive oligomer in the obtained copolymer is within the above range.

In the present invention, examples of the process for producing the copolymer include conventional processes such as the acid chloride process, the activated ester process and the condensation in the presence of an agent for condensation with dehydration such as polyphosphoric acid and dicylohexylcarbodiimide. For example, when the copolymer is prepared in accordance with the acid chloride process, dicarboxylic acid and thionyl chloride in an excess amount are reacted at a temperature in the range of the room temperature to about 130° C. in the presence of a solvent such as N,N-dimethylformamide. After the remaining amount of thionyl chloride is removed by heating under a reduced pressure, the residue is recrystallized from a solvent such as hexane and a dicarboxylic acid chloride is prepared.

When the dicarboxylic acid chloride thus prepared is used in combination with another dicarboxylic acid described above, the prepared dicarboxylic acid chloride and the chloride of the other dicarboxylic acids are dissolved, in general, into a polar solvent such as N-methyl-2-pyrrolidone and N,N-dimethylacetamide in combination with a bisaminophenol compound. The reaction is allowed to proceed in the prepared mixture at a temperature in the range of the room temperature to about −30° C. in the presence of an acid acceptor such as pyridine and triethylamine and the polyamide is synthesized. To the synthesized polyamide, a solution prepared in advance by dissolving the reactive oligomer into a solvent such as γ-butyrolactone is added and the reaction is allowed to proceed. The reaction liquid is added, for example, into a mixed solvent of water and isopropyl alcohol. After recovering and drying the formed precipitates, a copolymer formed by the reaction of the polyamide and the reactive oligomer can be obtained. It is also possible that a copolymer is obtained by reacting the acid chloride, the bisaminophenol compound and the reactive oligomer simultaneously in a polar solvent.

The ratio of the amounts by mole of the dicarboxylic acid chloride to the bisaminophenol compound used for the reaction affects the molecular weight of the obtained copolymer and is also important for controlling the chain end structure of the polyamide. The chain ends of the polyamide must have a structure reactive with the reactive group of the reactive oligomer in order to copolymerized the polyamide with the reactive oligomer. When the ratio of the amounts by mole of the dicarboxylic acid chloride to the bisaminophenol compound is smaller than 1, the obtained polyamide has amino group and hydroxyl group at the chain ends and can be copolymerized with the oligomer having carboxyl group. When the ratio of the amounts by mole of the dicarboxylic acid chloride to the bisaminophenol compound exceeds 1, the obtained polyamide has carboxyl group at the chain ends and can be copolymerized with the reactive oligomer having amino group or hydroxyl group. In this case, it is preferable that the oligomer has amino group having a greater nucleophilic reactivity as the reactive group at the chain ends.

Hydroxyl group at the chain ends of the oligomer can be converted into amino group, for example, in accordance with the following process. An oligomer having 4-nitrobenzoic acid ester group at the chain ends can be obtained by reacting the reactive oligomer having hydroxyl group at the chain ends with 4-nitrobenzoic acid chloride, in general, in a solvent such as tetrahydrofuran in the presence of an acid acceptor such as pyridine at a temperature in the range of the room temperature to about −30° C. The obtained oligomer having 4-nitrobenzoic acid ester group at the chain ends is dissolved in a solvent such as tetrahydrofuran and allowed to react in an atmosphere of hydrogen gas in the presence of a reducing catalyst such as palladium carbon. After the catalyst is removed from the reaction liquid, the liquid is concentrated and the solvent is removed. The obtained oligomer having 4-nitrobenzoic acid ester group at the chain ends can be used as the oligomer having amino group at the chain ends. It is also possible that a reactive oligomer having carboxyl group or isocyanate group is reacted with hydroxyl group in the structure of the main chain of the unit of the polyamide and a graft copolymer is synthesized. The reactive oligomer is not particularly limited as long as the reactive oligomer can react with hydroxyl group.

The material for an insulating film of the present invention may also comprise various other additives. Examples of the additive include surfactants, coupling agents such as silane coupling agents, radical initiators generating oxygen radical or sulfur radical by heating and catalysts such as disulfides.

When the polyamide in the present invention is represented by general formula [1] in which at least one of the groups represented by $R^1$ and $R^2$ or the groups represented by $R^3$ and $R^4$ is hydrogen, the polyamide can be used for a photosensitive resin composition of the positive type in combination with a naphthoquinonediazide compound as the photosensitizer. When the polyamide is represented by general formula [1] in which at least one of the groups represented by $R^1$ and $R^2$ or the groups represented by $R^3$ and $R^4$ is a photo-crosslinking group such as methacryloyl group, the polyamide can be used for a photosensitive resin composition of the negative type in combination with a photoinitiator.

As the application of the material for an insulating film of the present invention, the material can be dissolved or uniformly dispersed in a suitable organic solvent and used as a coating varnish. For example, the material for an insulating film is dissolved or uniformly dispersed in an organic solvent and glass, fiber, metal, a silicon wafer or a ceramic substrate is coated with the prepared solution or dispersion. Examples of the process for the coating include the dipping process, the screen printing process, the spraying process, the spin coating process and the roll coating process. After the coating, the solvent is vaporized by heating and the coating film is dried. A tack-free coating film can thus be obtained. It is preferable that the coating film is then subjected to a heat treatment so that the material is converted into a crosslinked material of a polybenzoxazole resin. The material for an insulating film can also be used as a polybenzoxazole resin soluble in solvents by suitably selecting the dicarboxylic acid component, the bisaminophenol component and the reactive oligomer component.

As the solvent for dissolving or dispersing the material for an insulating film of the present invention, a solvent in which solid components are completely dissolved is preferable. Examples of the solvent include N-methyl-2-pyrrolidone, γ-butyrolactone, N,N-dimethylacetamide, dimethylsulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol 3-monomethyl ether, methyl pyruvate, ethyl pyruvate, methyl 3-methoxypropionate, methyl ethyl ketone, methyl isobutyl ketone, cyclopentanone, cyclohexanone and tetrahydrofuran. The above solvents may be used singly or in combination of two or more.

The amount of the solvent for preparing the coating varnish is not particularly limited as long as the material for an insulating film can be completely dissolved and can be suitably selected in accordance with the application. In general, it is preferable that the amount of the solvent in the varnish is about 70 to 95% by weight.

When the coating film comprising the material for an insulating film of the present invention obtained as described above is treated by heating, in general, at a temperature in the range of 80 to 200° C. for removing the solvent and then at a temperature of about 200 to 500° C., cyclization by condensation and crosslinking take place and the polyamide unit in the material for an insulating film is converted into a polybenzoxazole resin. The unit of the reactive oligomer in the material for an insulating film is decomposed by heating and the products of the decomposition are vaporized. Thus, fine pores are formed in the layer of the resin comprising polybenzoxazole as the main structure and the insulating film of the present invention can be obtained as a porous insulating film. The heat history in the production of the insulating film is important for forming the fine pores.

In the insulating film of the present invention which comprises a layer comprising polybenzoxazole as the main structure and has fine pores, the diameters of the fine pores are, in general, 1 μm or smaller, preferably 500 nm or smaller and more preferably 100 nm or smaller although the diameters are varied depending on the application of the insulating film and the thickness of the film. When the insulating film is used for an insulating interlayer film for semiconductors, it is preferable that the diameters of the fine pores are 20 nm or smaller and more preferably 5 nm or smaller.

When the diameters of the pores are larger than 20 nm in the insulating interlayer film for semiconductors, the pores are distributed unevenly in the insulating film used as a layer between wiring layers and uniform electrical properties are not exhibited. Other problems take place, for example, in that mechanical strength of the film is decreased and that the adhesion is adversely affected. However, the optimum thickness of the film and the optimum diameters of the pores are selected in accordance with the application of the film and it is not always necessary that the diameters of the pores be 5 nm or smaller.

It is preferable that the fraction of pores in the insulating film is 5 to 70%, more preferably 5 to 50% and most preferably 5 to 40%. When the fraction of pores is smaller than 5%, it is difficult that a sufficiently decreased permittivity is exhibited. When the fraction of pores exceeds 70%, there is the possibility that mechanical strength of the film decreases and adhesion is adversely affected.

The thickness of the insulating film of the present invention is different depending on the object of the application. The thickness is, in general, in the range of 0.1 to 100 μm, preferably in the range of 0.1 to 50 μm and more preferably in the range of 0.1 to 20 μm.

The material for an insulating film and the insulating film of the present invention can be used for insulating interlayer films and surface protective films in semiconductors, insulating interlayer films of multi-layer circuits, cover coats of flexible copper clad laminates, solder resist films and liquid crystal-aligning films.

When the insulating film of the present invention is used for an insulating interlayer film for a multi-layer wiring of a semiconductor device, a semiconductor substrate is coated with an adhesive coating material for improving the adhesive property. Examples of the coating process include the spin coating process using a spinner, the spray coating process using a spray coater, the dipping process, the printing process and the roll coating process. An adhesive coating film is formed by prebaking the formed coating film at a temperature of the boiling point of the solvent or higher so that the organic solvent is vaporized and the film is dried.

The adhesive coating film formed above is then coated with a solution of the material for an insulating film of the present invention and a laminated film is formed. The obtained coating film is prebaked in the above condition so that the organic solvent is vaporized and the film is dried. The dried film is then treated by heating and the insulating interlayer film can be formed as the resin film having fine pores.

A surface protective film can be obtained by forming a resin film in a manner similar to that described above.

To summarize the advantages of the present invention, the insulating film obtained from the material for an insulating film and the coating varnish of the present invention can exhibit excellent thermal properties, electrical properties and water absorption. The insulation film has, in particular, very low permittivity and is advantageously used for insulating interlayer films and surface protective films in semiconductors, insulating interlayer films of multi-layer circuits, cover coats of flexible copper clad laminates, solder resist films and liquid crystal-aligning films.

EXAMPLES

The present invention will be described more specifically with reference to examples in the following. However, the present invention is not limited to the examples.

The specific permittivity, the heat resistance, the glass transition temperature and the water absorption of films prepared in Examples and Comparative Examples were measured in accordance with the following methods and sections of the films were observed.

(1) Specific Permittivity

The specific permittivity was measured in accordance with the method of Japanese Industrial Standard K6911 using HP-4284A PRECISION LCR METER manufactured by HEWLETT PACKARD Company at a frequency of 100 kHz.

(2) Heat Resistance

The thermogravimetric analysis of a film was conducted using an instrument TG/DTA6200 manufactured by SEIKO INSTRUMENTS Co., Ltd. under a flow of the nitrogen gas at 200 ml/minute while the temperature was raised at a rate of 10° C./minute. The temperature at which the decrease in the weight reached 5% was used as the heat resistance.

(3) Glass Transition Temperature

The thermomechanical property of a film was measured by an instrument DMS6100 manufactured by SEIKO INSTRUMENTS Co., Ltd. under a flow of the nitrogen gas at 300 ml/minute under dynamic deformation of the elongation mode at a frequency of 1 Hz while the temperature was raised at a rate of 3° C./minute. The peak top temperature of the loss tangent (tan δ) was used as the glass transition temperature.

(4) Water Absorption

A test film of a 5 cm square having a thickness of 10 μm was dipped into pure water at 23° C. for 24 hours. The change in the weight of the test film was measured and used as the water absorption.

(5) Observation of the Section of a Film

The presence or absence of fine pores was observed and, when present, the diameters of the pores were measured in the section of a film using a transmission electron microscope (TEM).

Preparation Example 1

Styrene in an amount of 10 g (96 mmole) was dissolved into 100 g of tetrahydrofuran which was dried under an atmosphere of dry nitrogen and the resultant solution was cooled to −78° C. To the cooled solution, 0.77 ml of a 1.3 mole/liter solution of sec-butyllithium (the solvent: cyclohexane) as the reaction reagent was added and the resultant mixture was stirred for 3 hours. Then, 0.044 g (1.0 mmole) of ethylene oxide was added and the resultant solution was stirred for 3 hours. To the solution, 3 g of methanol was added and then the solution was concentrated to remove the solvent. The obtained product was dissolved in 100 g of tetrahydrofuran and the resultant solution was filtered. The filtrate was dried in vacuo and a styrene oligomer having hydroxyl group at the chain ends and a number-average molecular weight of 9,600 was obtained.

The obtained oligomer in an amount of 93 g (9.68 mmole) was dissolved into 80 g of tetrahydrofuran which was dried under an atmosphere of dry nitrogen. To the resultant solution, 1.15 g (14.52 mmole) of pyridine was added dropwise. Then, a solution obtained by dissolving 2.63 g (14.52 mmole) of 4-nitrobenzoic acid chloride into 20 g of tetrahydrofuran was added at 5° C. over 30 minutes. After the addition was completed, the temperature of the solution was raised to the room temperature and the solution was stirred at the room temperature for 24 hours. The reaction product was filtered and pyridine hydrochloride was removed. After the filtrate was concentrated to remove the solvent, 4-nitrobenzoic acid ester of the styrene oligomer was obtained. The 4-nitrobenzoic acid ester of the styrene oligomer was dissolved into 100 g of tetrahydrofuran. To the obtained solution, 0.5 g of a 5% by weight palladium carbon was mixed under an atmosphere of hydrogen gas and the resultant mixture was stirred at the room temperature for 24 hours. After the reaction liquid was filtered with Celite and concentrated to remove the solvent, a styrene oligomer having 4-aminobenzoic acid ester group at the chain ends was obtained.

Preparation Example 2

In accordance with the same procedures as those conducted in Preparation Example 1 except that 38.72 g (9.68 mmole) of poly(propylene glycol)monobutyl ether having a number-average molecular weight of 4,000 [manufactured by ALDRICH Company] was used in place of 93 g (9.68 mmole) of the styrene oligomer having a number-average molecular weight of 9,600 used in Preparation Example 1, a polypropylene glycol) oligomer having 4-aminobenzoic acid ester group at the chain ends and a number-average molecular weight of 2,500 was obtained.

Preparation Example 3

In accordance with the same procedures as those conducted in Preparation Example 1 except that 49.9 g (480 mmole) of styrene was used in place of 10 g (96 mmole) of styrene, polystyrene having hydroxyl group at the chain ends and a number-average molecular weight of 50,000 was obtained.

The obtained polystyrene in an amount of 100 g (2 mmole) was dissolved into 100 g of tetrahydrofuran which was dried under an atmosphere of dry nitrogen. To the resultant solution, 1.15 g (14.52 mmole) of pyridine was added dropwise. Then, a solution obtained by dissolving 2.63 g (14.52 mmole) of 4-nitrobenzoic acid chloride into 20 g of tetrahydrofuran was added at 5° C. over 30 minutes. After the addition was completed, the temperature of the solution was raised to the room temperature and the solution was stirred at the room temperature for 24 hours. The reaction product was filtered and pyridine hydrochloride was removed. After the filtrated was concentrated to remove the solvent, 4-nitrobenzoic acid ester of polystyrene was obtained. The 4-nitrobenzoic acid ester of polystyrene was dissolved into 100 g of tetrahydrofuran. To the obtained solution, 0.5 g of a 5% by weight palladium carbon was mixed under an atmosphere of hydrogen gas and the resultant mixture was stirred at the room temperature for 24 hours. After the reaction liquid was filtered with Celite and concentrated to remove the solvent, polystyrene having 4-aminobenzoic acid ester group at the chain ends was obtained.

Preparation Example 4

Preparation of 5-ethynylisophthalic acid dichloride (1) Synthesis of dimethyl 5-trifluoromethanesulfonyloxyisophthalate Into a 5 liter four-necked flask equipped with a thermometer, a Dimroth condenser, a tube containing calcium chloride and a stirrer, 190.0 g (0.904 mole) of dimethyl 5-hydroxyisophthlate, 3 liters of dehydrated toluene and 214.7 g (2.718 mole) of dehydrated pyridine were placed and the resultant mixture was cooled to −30° C. while being stirred. To the cooled mixture, 510.2 g (1.808 mole) of anhydrous trifluorosulfonic acid was added dropwise slowly and carefully so that the temperature was not raised at −25° C. or higher. It took 1 hour before the addition was completed. After the addition was completed, the temperature of the reaction mixture was raised to 0° C. and the reaction was allowed to proceed for 1 hour. The temperature was then raised to the room temperature and the reaction was allowed to proceed for 5 hours. The obtained reaction mixture was poured into 4 liters of ice water and the aqueous layer and the organic layer were separated. The aqueous layer was treated twice by extraction with 500 ml of toluene and the extracts were combined with the organic layer. The combined organic solution was washed twice with 3 liters of water and dried with 100 g of anhydrous magnesium sulfate. Anhydrous magnesium sulfate was removed by filtration and toluene was removed by distillation using a rotary evaporator. The resultant product was dried in vacuo and 294.0 g (the yield: 95%) of dimethyl 5-trifluoromethanesulfonyloxyisophthalate was obtained as a light yellow solid. The crude product was recrystallized from hexane and white needle crystals were obtained. The crystals were used for the next reaction.

(2) Synthesis of 4-[3,5-bis(methoxycarbonyl)phenyl]-2-methyl-3-butyn-1-ol

Into a 1 liter four-necked flask equipped with a thermometer, a Dimroth condenser, an inlet for the nitrogen gas and a stirrer, 125 g (0.365 mole) of dimethyl 5-trifluoromethanesulfonyloxyisophthalate, 1.1 g (0.0419 mole) of triphenylphosphine, 0.275 g (0.00144 mole) of copper iodide and 33.73 g (0.401 mole) of 3-methyl-1-butyn-3-ol were placed and the nitrogen gas was passed through the flask. To the above mixture, 375 ml of dehydrated triethylamine and 200 ml of dehydrated pyridine were added and dissolved by stirring the mixture. After the flow of the nitrogen gas was continued for 1 hour, 0.3 g (0.000427 mole) of dichlorobis(triphenylphosphine)palladium was quickly added and the resultant mixture was heated under the refluxing condition in an oil bath for 1 hour. Then, triethylamine and pyridine were removed by distillation in vacuo and a viscous brown solution was obtained. The solution was poured into 500 ml of water and the formed solid substances were separated by filtration and washed twice with 500 ml of water, 500 ml of a hydrochloric acid having a concentration of 5 mole/liter and 500 ml of water. The obtained solid substance was dried at 50° C. in vacuo and 98.8 g (the yield: 98%) of 4-[3,5-bis(methoxycarbonyl)phenyl]-2-methyl-3-butyn-1-ol was obtained.

(3) Synthesis of dipotassium 5-ethynylisophthalate

Into a 5 liter four-necked flask equipped with a thermometer, a Dimroth condenser and a stirrer, 3 liters of n-butanol and 182 g (2.763 mole) of potassium hydroxide (85%) were placed and potassium hydroxide was dissolved into n-butanol by heating under the refluxing condition. To the resultant solution, 95 g (0.344 mole) of 4-[3,5-bis(methoxycarbonyl)phenyl]-2-methyl-3-butyn-1-ol synthesized above in (2) was added and the resultant mixture was heated under the refluxing condition for 30 minutes. The mixture was then cooled in an ice bath. The formed crystals were separated by filtration, washed twice with 1 liter of methanol and dried at 60° C. in vacuo and 88.87 g (the yield: 97%) of dipotassium 5-ethynylisophthalate was obtained.

(4) Synthesis of 5-ethynylisophthalic acid dichloride

Into a 2 liter four-necked flask equipped with a thermometer, a Dimroth condenser and a stirrer, 80 g (0.3 mole) of dipotassium 5-ethynylisophthalate obtained above in (3) and 400 ml of chloroform were placed and the resultant mixture was cooled to 0° C. To the cooled mixture, 391 g (4.5 mole) of thionyl chloride was added dropwise at a temperature of 5° C. or lower over 1 hour. Then, 4 ml of dimethylformamide and 4 g of hydroquinone were added and the resultant mixture was stirred at 45 to 50° C. for 3 hours. After the reaction mixture was cooled, crystals were separated by filtration and washed with 150 ml of chloroform. The filtrate and the washing liquid were combined and concentrated at a temperature of 40° C. or lower. The obtained residue was treated twice by extraction with 200 ml of diethyl ether and filtered. Diethyl ether was removed from the extract by distillation in vacuo and a semi-solid crude product was obtained. The crude product was then washed with dry n-hexane and recrystallized from diethyl ether and 13 g (the yield: 19%) of 5-ethynylisophthalic acid dichloride was obtained.

In accordance with the procedures similar to those conducted above, 5-ethynylterephthalic acid dichloride and 4-ethynyl-2,6-naphthalene-dicarboxylic acid dichloride were prepared.

Preparation Example 5

Preparation of 5-phenylethynylisophthalic acid dichloride (1) Synthesis of 5-bromoisophthalic acid Into a 1 liter four-necked flask equipped with a thermometer, a stirrer and a dropping funnel, 99.18 g (0.55 mole) of 5-aminoisophthalic acid, 165 ml of a 48% by weight hydrobromic acid and 150 ml of distilled water were placed and stirred. After the flask was cooled at a temperature of 5° C. or lower, a solution prepared by dissolving 39.4 g (0.57 mole) of sodium nitrite into 525 ml of distilled water was added dropwise to the solution obtained above over 1 hour and an aqueous solution of a diazonium salt was obtained. Into a 3 liter four-necked flask equipped with a thermometer, a Dimroth condenser, a dropping funnel and a stirrer, 94.25 g (0.66 mole) of copper(I) bromide and 45 ml of a 48% by weight hydrobromic acid were placed and stirred. The flask was cooled at a temperature of 0° C. or lower and the aqueous solution of a diazonium salt prepared above was added dropwise over 2 hours. After the addition was completed, the reaction mixture was stirred at the room temperature for 30 minutes and then heated under the refluxing condition for 30 minutes. After the reaction mixture was left standing and cooled, the formed precipitates were separated by filtration and washed twice with 2 liters of water. The obtained white solid was dried in vacuo at 50° C. for 2 days and 117 g of a crude product was obtained. The product was used in the following step without purification.

(2) Synthesis of dimethyl 5-bromoisophthalate

Into a 500 ml flask equipped with a stirrer and a Dimroth condenser, 110 g of 5-bromoisophthalic acid obtained above in (1), 500 ml of methanol and 10 g of a concentrated sulfuric acid were placed and heated under the refluxing condition for 6 hours. After the resulting mixture was left standing and cooled, the mixture was added dropwise to 1 liter of distilled water. The obtained solution was neutralized with a 5% by weight aqueous solution of sodium hydrogencarbonate. The formed precipitates were separated by filtration and washed twice with 2 liters of distilled water. The obtained white solid was dried in vacuo at 50° C. for 2 days and 109 g (0.4 mole; the yield: 89%) of dimethyl 5-bromoisophthalate was obtained.

(3) Synthesis of 5-phenylethynylisophthalic acid dichloride

In accordance with the same procedures as those conducted in (2) in Preparation Example 1 except that 99.7 g (0.365 mole) of dimethyl 5-bromoisophthalate was used in place of 125 g (0.365 mole) of dimethyl 5-trifluoromethanesulfonyloxyisophthalate, 80.8 g (the yield: 75%) of 1-[3,5-bis(methoxycarbonyl)phenyl]-2-phenylethyne was obtained.

In accordance with the same procedures as those conducted in (3) and (4) in Preparation Example 1, dipotassium 5-(2-phenylethynyl)isophthalate and 5-(2-phenylethynyl) isophthalic acid dichloride, successively, were obtained.

Preparation Example 6

Preparation of 4,4'-tolanedicarboxyhc acid dichloride (1) Synthesis of methyl 4-ethynylbenzoate In accordance with the process described in J. Org. Chem., Volume 57, Pages 6998 to 6999 (1962), 4-ethynylbenzoic acid chloride was synthesized.

Then, a solution prepared by dissolving 24.7 g (0.15 mole) of 4-ethynylbenzoic acid chloride in 30 ml of tetrahydrofuran was added dropwise into 300 ml of methanol cooled in an ice bath. After the addition was completed, the reaction solution became turbid in 20 minutes. The reaction mixture was kept being stirred for 2 hours in the ice bath and then stirred at the room temperature for further 2 hours. The reaction mixture was filtered and dried and 21 g (the yield: 87%) of methyl 4-ethynylbenzoate was obtained.

(2) Synthesis of dimethyl 4,4'-tolandicarboxylate

A mixture containing 16.0 g (0.1 mole) of methyl 4-ethynylbenzoate obtained above in (1), 21.5 g (0.1 mole) of methyl 4-bromobenzoate, 0.288 g (0.0011 mole) of triphenylphosphine, 0.07 g (0.00037 mole) of copper(I) iodide, 250 ml of triethylamine and 37.5 ml of pyridine was stirred and the temperature was raised until the refluxing started at 87° C. Then, the temperature was lowered until the refluxing stopped. At this temperature, 0.098 g (0.00014 mole) of dichlorobis(triphenylphosphine)-palladium was added and the resultant mixture was heated under the refluxing condition for 3 hours. The reaction mixture was cooled and concentrated using a rotary evaporator. The formed precipitates were separated by filtration, dried and washed twice with 500 ml of ethyl acetate.

The obtained product was placed into tetrahydrofuran and stirred under heating. Then, the mixture was filtered at a high temperature. After recrystallization from the obtained filtrate, 14.7 g (the yield: 50%) of dimethyl 4,4'-tolandicarboxylate was obtained.

(3) Synthesis of 4,4'-tolandicarboxylic acid dichloride

Potassium hydroxide in an amount of 16.83 g (0.3 mole) was dissolved into 450 ml of methanol. After 8.22 g (0.033 mole) of dimethyl tolandicarboxylate obtained above in (2) was added to the resultant solution, the temperature was raised and the mixture was heated under the refluxing condition for 18 hours. The reaction mixture was then cooled. The formed precipitates were recovered by filtration and dissolved into 1 liter of water. After insoluble residues in the solution was removed by filtration, pH of the filtrate was slowly adjusted to 3 with a hydrochloric acid having a concentration of 0.1 mole/liter. The formed precipitates of 4,4'-tolandicarboxylic acid were separated by filtration and dried and 6.7 g (the yield: 76%) of 4,4'-tolandicarboxylic acid was obtained.

4,4'-Tolandicarboxylic acid obtained above in an amount of 6.5 g (0.024 mole), 60 ml of 1,2-dichloroethane, 10.013 g of benzyl triethylammonium chloride and 3.9 ml of thionyl chloride were mixed together. The temperature was raised and the mixture was heated under the refluxing condition for 10 hours. To the resultant reaction mixture, 40 ml of n-hexane was added. The resultant mixture was filtered at a high temperature and crystals were obtained from the filtrate. The crystals were recrystallized from a mixed solvent of 1,2-dichloroethane and hexane and 3 g (the yield: 41%) of 4,4'-tolandicarboxylic acid dichloride was obtained.

Preparation Example 7

Preparation of 2,2'-bis(phenylethynyl)-4,4'-biphenyldicarboxylic acid dichloride (1) Synthesis of dimethyl 2,2'-bis(phenylethynyl)-4,4'-biphenyl-dicarboxylate Dimethyl 4,4'-biphenyldicarboxylate in an amount of 25 g (0.092 mole) was added into 300 ml of a concentrated sulfuric acid in combination with 55 g (0.22 mole) of iodine. As the catalyst, 85 g of silver sulfate was added and the resultant mixture was stirred at the room temperature for 1 hour. The temperature was raised to 80° C. and the reaction mixture was stirred for 18 hours. The reaction mixture was added dropwise to ice water and yellow precipitates were obtained. The precipitates were washed twice with water, filtered and dried at 80° C. in vacuo for 24 hours. The obtained dried product was purified by extraction with methanol using a Soxhlet extractor for 24 hours and recrystallized from methanol and 41 g (the yield: 85%) of dimethyl 2,2'-diiodo-4,4'-biphenyldicarboxylate was obtained as yellow crystals.

Dimethyl 2,2'-diiodo-4,4'-biphenyldicarboxylate obtained above in an amount of 26 g (0.05 mole), 0.08 g of copper iodide and 0.11 g of bis(triphenylphosphine)palladium were added into 120 ml of pyridine and the mixture was stirred at the room temperature for 1 hour. To the resultant reaction mixture, a solution prepared by adding 12.5 g (0.122 mole) of phenylacetylene into 60 ml of pyridine was slowly added. The temperature of the obtained mixture was raised to 80° C. and the mixture was kept being stirred at this temperature for 5 hours. The mixture was then cooled to the room temperature and the precipitated salts were removed by filtration. After pyridine was removed by distillation using a rotary evaporator, a crude product was obtained. The crude product was dissolved into 200 ml of diethyl ether and washed with a 5% by weight hydrochloric acid and water. After recrystallization from a mixed solvent of hexane and toluene (90/10 v/v), 16 g (the yield: 68%) of dimethyl 2,2'-bis(phenylethynyl)-4,4'-biphenyldicarboxylate was obtained.

(2) Synthesis of 2,2'-bis(phenylethynyl)-4,4'-biphenyldicarboxylic acid dichloride A mixture containing 14 g (0.03 mole) of dimethyl 2,2'-bis(phenylethynyl)-4,4'-biphenyldicarboxylate obtained above in (1) and 120 ml of an ethanol solution of potassium hydroxide having a concentration of 1 mole/liter was heated under the refluxing condition for 2 hours. The protection was removed with a dilute hydrochloric acid and yellow precipitates were obtained. The precipitates were separated by filtration, dried and recrystallized from a mixed solvent of toluene and methanol (90/10 v/v) and 12 g (the yield: 90%) of 2,2'-bis(phenylethynyl)-4,4'-biphenyldicarboxylic acid was obtained.

A mixture of 4.5 g (0.01 mole) of 2,2'-bis(phenylethynyl)-4,4'-biphenyldicarboxylic acid obtained above, 1 ml of N,N-dimethylformamide and 100 ml of thionyl chloride was heated under the refluxing condition for 6 hours and then the remaining thionyl chloride was removed by distillation in vacuo. The obtained crude product was recrystallized from a mixed solvent of hexane and chloroform (90/10 v/v) and 4.0 g (the yield: 82%) of 2,2'-bis(phenylethynyl)-4,4'-biphenyldicarboxylic acid dichloride was obtained.

In accordance with the procedures similar to those conducted above, 2,2'-bis(naphthylethynyl)-4,4'-biphenyldicarboxylic acid dichloride was prepared.

Preparation Example 8

Preparation of 2,7-biphenylenedicarboxylic acid dichloride

In accordance with the process described in J. Poly. Sci.: Polymer Letters Edition, Volume 16, Pages 653 to 656 (1978), 2,7-biphenylene-dicarboxylic acid dichloride was prepared.

Example 1

2,2-bis(3-Amino-4-hydroxyphenyl)hexafluoropropane in an amount of 35.9 g (0.098 mole) was dissolved into 330 ml of dry N-methyl-2-pyrrolidone. To the resultant solution, 27.7 g (0.1 mole) of 4-ethynyl-2,6-naphthalenedicarboxylic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 38.4 g (0.004 mole) of a styrene oligomer having 4-aminobenzoic acid ester group at the chain ends which was synthesized in Preparation Example 1 (the number-average molecular weight: 9,600) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 80.9 g of a copolymer was obtained. The molecular weight of the obtained copolymer was measured by a GPC apparatus manufactured by TOSO Co., Ltd. as the molecular weight of the corresponding polystyrene. The weight-average molecular weight was 30,000 and the molecular weight distribution was 2.23. The fraction of the reactive oligomer component introduced into the copolymer was obtained in accordance with $^1$NMR and found to be 36% by weight.

The obtained copolymer in an amount of 5.00 g was dissolved into 20.00 g of N-methyl-2-pyrrolidone. The resultant solution was filtered by a Teflon filter of 0.2 μm and a varnish was obtained. A silicon wafer having a vapor deposition film of aluminum was coated with the varnish using a spin coater. The speed of rotation and the time of coating were set in a manner such that the film obtained after a heat treatment had a thickness of about 5 μm. After the coating, the film was dried on a hot plate heated at 120° C. for 240 seconds. Then, in an oven in which the concentration of oxygen was controlled at 10 ppm or smaller by introducing a flow of nitrogen gas, the film was heated at 300° C. for 60 minutes and a film of a polybenzoxazole resin having the oligomer reacted at the chain ends was obtained. The film was further heated at 400° C. for 60 minutes so that the units of the oligomer were decomposed and a film of a polybenzoxazole resin having pores was obtained. The patterning was conducted by vapor deposition of aluminum on the obtained film and an electrode having a specific size was formed. The capacity between aluminum on the face of the silicon wafer and the electrode was measured. After the measurement, a portion of the film adjacent to the electrode was treated by the etching with oxygen plasma and the thickness of the film was measured by a surface roughness meter. The permittivity at 1 MHz was calculated based on the obtained data and found to be 2.54. A section of the film was observed by TEM and the formed pores were found to be independent fine pores having diameters of 15 nm or smaller. The results are shown in Table 1 together with the heat resistance, Tg and the water absorption.

Example 2

2,2-bis(3-Amino-4-hydroxyphenyl)hexafluoropropane in an amount of 33.0 g (0.09 mole) was dissolved into 330 ml of dry N-methyl-2-pyrrolidone. To the resultant solution, 22.7 g (0.1 mole) of 5-ethynylterephthalic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 56.0 g (0.02 mole) of a poly(ethylene glycol)-block-poly(propylene glycol)-block-(polyethylene glycol) having hydroxyl group at the chain ends (manufactured by ALDRICH Company; the number-average molecular weight: 2,800) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 89.1 g of a copolymer was obtained. The molecular weight of the obtained copolymer was measured by a GPC apparatus manufactured by TOSO Co., Ltd. as the molecular weight of the corresponding polystyrene. The weight-average molecular weight was 20,000 and the molecular weight distribution was 2.2. The fraction of the reactive oligomer component introduced into the copolymer was obtained in accordance with ¹NMR and found to be 48% by weight.

A sample for evaluation was obtained from the copolymer obtained above in accordance with the same procedures as those conducted in Example 1. The results of the measurements are shown together in Table 1.

Example 3

9,9-bis(4-((4-Amino-3-hydroxy)phenoxy)phenyl)fluorene in an amount of 53.6 g (0.095 mole) was dissolved into 330 ml of dry N-methyl-2-pyrrolidone. To the resultant solution, 22.7 g (0.1 mole) of 5-ethynylisophthalic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 40.0 g (0.01 mole) of poly(propylene glycol)bis (2-aminopropyl ether) (manufactured by ALDRICH Company; the number-average molecular weight: 4,000) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 96.7 g of a copolymer was obtained. The molecular weight of the obtained copolymer was measured by a GPC apparatus manufactured by TOSO Co., Ltd. as the molecular weight of the corresponding polystyrene. The weight-average molecular weight was 25,200 and the molecular weight distribution was 2.20. The fraction of the reactive oligomer component introduced into the copolymer was obtained in accordance with ¹NMR and found to be 34% by weight.

A sample for evaluation was obtained from the copolymer obtained above in accordance with the same procedures as those conducted in Example 1. The results of the measurements are shown together in Table 1.

Example 4

2,2-bis(3-Amino-4-hydroxyphenyl)hexafluoropropane in an amount of 69.6 g (0.19 mole) was dissolved into 330 ml of dry N-methyl-2-pyrrolidone. To the resultant solution, 22.7 g (0.1 mole) of 5-ethynylterephthalic acid dichloride and 25.3 g (0.1 mole) of 2,6-naphthalenedicarboxylic acid dichloride were added under dry nitrogen at 10° C. After the addition was completed, the resultant solution was stirred at 10° C. for 1 hour and then at 20° C. for 1 hour. After the temperature was adjusted to 10° C., 44.5 g (0.44 mole) of triethylamine was added and then a solution prepared by dissolving 50 g (0.02 mole) of the poly(propylene glycol) oligomer having 4-aminobenzoic acid ester group at the chain ends which was synthesized in Preparation Example 2 (the number-average molecular weight: 2,500) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 138.6 g of a copolymer was obtained. The molecular weight of the obtained copolymer was measured by a GPC apparatus manufactured by TOSO Co., Ltd. as the molecular weight of the corresponding polystyrene. The weight-average molecular weight was 25,000 and the molecular weight distribution was 2.25. The fraction of the reactive oligomer component introduced into the copolymer was obtained in accordance with ¹NMR and found to be 27% by weight.

A sample for evaluation was obtained from the copolymer obtained above in accordance with the same procedures as those conducted in Example 1. The results of the measurements are shown together in Table 1.

Example 5

2,2-bis(3-Amino-4-hydroxyphenyl)hexafluoropropane in an amount of 34.8 g (0.095 mole) was dissolved into 330 ml of dry N-methyl-2-pyrrolidone. To the resultant solution, 30.3 g (0.1 mole) of 5-phenylethynylisophthalic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 40 g (0.01 mole) of a poly(propylene glycol)bis (2-aminopropyl ether) (manufactured by ALDRICH Company; the number-average molecular weight: 4,000) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 87.9 g of a copolymer was obtained. The molecular weight of the obtained copolymer was measured by a GPC apparatus manufactured by TOSO Co., Ltd. as the molecular weight of the corresponding polystyrene. The weight-average molecular weight was 25,000 and the molecular weight distribution was 2.20. The fraction of the reactive oligomer component introduced into the copolymer was obtained in accordance with ¹NMR and found to be 36% by weight.

A sample for evaluation was obtained from the copolymer obtained above in accordance with the same procedures as those conducted in Example 1. The results of the measurements are shown together in Table 1.

Example 6

2,2-bis(3-Amino-4-hydroxyphenyl)hexafluoropropane in an amount of 34.8 g (0.095 mole) was dissolved into 330 ml of dry N-methyl-2-pyrrolidone. To the resultant solution, 27.6 g (0.1 mole) of 2,7-biphenylenedicarboxylic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 40 g (0.01 mole) of poly(propylene glycol)bis(2-aminopropyl ether) (manufactured by ALDRICH Company; the number-average molecular weight: 4,000) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 87.7 g of a copolymer was obtained. The molecular weight of the obtained copolymer was measured by a GPC apparatus manufactured by TOSO Co., Ltd. as the molecular weight of the corresponding polystyrene. The weight-average molecular weight was 25,300 and the molecular weight distribution was 2.21. The fraction of the reactive oligomer component introduced into the copolymer was obtained in accordance with $^1$NMR and found to be 38% by weight.

A sample for evaluation was obtained from the copolymer obtained above in accordance with the same procedures as those conducted in Example 1. The results of the measurements are shown together in Table 1.

Example 7

2,2-bis(3-Amino-4-hydroxyphenyl)hexafluoropropane in an amount of 34.8 g (0.095 mole) was dissolved into 330 ml of dry N-methyl-2-pyrrolidone. To the resultant solution, 30.3 g (0.1 mole) of 4,4'-tolandicarboxylic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 40 g (0.01 mole) of poly(propylene glycol)bis(2-aminopropyl ether) (manufactured by ALDRICH Company; the number-average molecular weight: 4,000) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 90.8 g of a copolymer was obtained. The molecular weight of the obtained copolymer was measured by a GPC apparatus manufactured by TOSO Co., Ltd. as the molecular weight of the corresponding polystyrene. The weight-average molecular weight was 25,100 and the molecular weight distribution was 2.21. The fraction of the reactive oligomer component introduced into the copolymer was obtained in accordance with $^1$NMR and found to be 37% by weight.

A sample for evaluation was obtained from the copolymer obtained above in accordance with the same procedures as those conducted in Example 1. The results of the measurements are shown together in Table 1.

Example 8

9,9-bis(4-((4-Amino-3-hydroxy)phenoxy)phenyl)fluorene in an amount of 119.2 g (0.21 mole) was dissolved into 900 ml of dry N-methyl-2-pyrrolidone. To the resultant solution, 22.7 g (0.1 mole) of 5-ethynylisophthalic acid dichloride, 30.3 g (0.1 mole) of 5-phenylethynylisophthalic acid dichloride and 4.5 g (0.022 mole) of isophthalic acid dichloride were added under dry nitrogen at 10° C. After the addition was completed, the resultant solution was stirred at 10° C. for 1 hour and then at 20° C. for 1 hour. After the temperature was adjusted to 10° C., 49.5 g (0.49 mole) of triethylamine was added and then a solution prepared by dissolving 88.9 g (0.022 mole) of poly(propylene glycol)bis(2-aminopropyl ether) (manufactured by ALDRICH Company; the number-average molecular weight: 4,000) into 250 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 15 liters of ion-exchanged water and 15 liters of isopropanol. The precipitates were collected and dried and 211.8 g of a copolymer was obtained. The molecular weight of the obtained copolymer was measured by a GPC apparatus manufactured by TOSO Co., Ltd. as the molecular weight of the corresponding polystyrene. The weight-average molecular weight was 25,000 and the molecular weight distribution was 2.20. The fraction of the reactive oligomer component introduced into the copolymer was obtained in accordance with $^1$NMR and found to be 33% by weight.

A sample for evaluation was obtained from the copolymer obtained above in accordance with the same procedures as those conducted in Example 1. The results of the measurements are shown together in Table 1.

Example 9

9,9-bis(4-((4-Amino-3-hydroxy)phenoxy)phenyl)fluorene in an amount of 71.5 g (0.13 mole) was dissolved into 550 ml of dry N-methyl-2-pyrrolidone. To the resultant solution, 7.6 g (0.033 mole) of 5-ethynylisophthalic acid dichloride and 30.3 g (0.1 mole) of 5-phenylethynylisophthalic acid dichloride were added under dry nitrogen at 10° C. After the addition was completed, the resultant solution was stirred at 10° C. for 1 hour and then at 20° C. for 1 hour. After the temperature was adjusted to 10° C., 29.7 g (0.29 mole) of triethylamine was added and then a solution prepared by dissolving 53.3 g (0.013 mole) of poly(propylene glycol)bis(2-aminopropyl ether) (manufactured by ALDRICH Company; the number-average molecular weight: 4,000) into 150 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 11 liters of ion-exchanged water and 11 liters of isopropanol. The precipitates were collected and dried and 137.7 g of a copolymer was obtained. The molecular weight of the obtained copolymer was measured by a GPC apparatus manufactured by TOSO Co., Ltd. as the molecular weight of the corresponding polystyrene. The weight-average molecular weight was 24,000 and the molecular weight distribution was 2.10. The fraction of the reactive oligomer component introduced into the copolymer was obtained in accordance with $^1$NMR and found to be 32% by weight.

A sample for evaluation was obtained from the copolymer obtained above in accordance with the same procedures as those conducted in Example 1. The results of the measurements are shown together in Table 1.

Example 10

2,2-bis(3-Amino-4-hydroxyphenyl)hexafluoropropane in an amount of 34.8 g (0.095 mole) was dissolved into 330 ml of dry N-methyl-2-pyrrolidone. To the resultant solution, 47.9 g (0.1 mole) of 2,2'-bis(phenylethynyl)-4,4'-biphenyldicarboxylic acid dichloride was added under dry nitrogen at 10° C. After the addition was completed, the resultant solution was stirred at 100C for 1 hour and then at 20° C. for 1 hour. After the temperature was adjusted to 10° C., 22.3 g (0.22 mole) of triethylamine was added and then a solution prepared by dissolving 28.0 g (0.01 mole) of a poly(ethylene glycol)-block-poly(propylene glycol)-block-(polyethylene glycol) having hydroxyl group at the chain ends (manufactured by ALDRICH Company; the number-average molecular weight: 2,800) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 88.1 g of a copolymer was obtained. The molecular weight of the obtained copolymer was measured by a GPC apparatus manufactured by TOSO Co., Ltd. as the molecular weight of the corresponding polystyrene. The weight-average molecular weight was 25,000 and the molecular weight distribution was 2.2. The fraction of the reactive oligomer component introduced into the copolymer was obtained in accordance with $^1$NMR and found to be 25.8% by weight.

A sample for evaluation was obtained from the copolymer obtained above in accordance with the same procedures as those conducted in Example 1. The results of the measurements are shown together in Table 1.

Example 11

2,2-bis(3-Amino-4-hydroxyphenyl)hexafluoropropane in an amount of 34.8 g (0.095 mole) was dissolved into 330 ml of dry N-methyl-2-pyrrolidone. To the resultant solution, 57.9 g (0.1 mole) of 2,2'-bis(naphthylethynyl)-4,4'-biphenyldicarboxylic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 28.0 g (0.01 mole) of a poly(ethylene glycol)-block-poly(propylene glycol)-block-(polyethylene glycol) having hydroxyl group at the chain ends (manufactured by ALDRICH Company; the number-average molecular weight: 2,800) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 98.5 g of a copolymer was obtained. The molecular weight of the obtained copolymer was measured by a GPC apparatus manufactured by TOSO Co., Ltd. as the molecular weight of the corresponding polystyrene. The weight-average molecular weight was 24,000 and the molecular weight distribution was 2.1. The fraction of the reactive oligomer component introduced into the copolymer was obtained in accordance with $^1$NMR and found to be 23.5% by weight.

A sample for evaluation was obtained from the copolymer obtained above in accordance with the same procedures as those conducted in Example 1. The results of the measurements are shown together in Table 1.

Example 12

2,2-bis(3-Amino-4-hydroxyphenyl)hexafluoropropane in an amount of 34.8 g (0.095 mole) was dissolved into 330 ml of dry N-methyl-2-pyrrolidone. To the resultant solution, 33.5 g (0.07 mole) of 2,2'-bis(phenylethynyl)-4,4'-biphenyldicarboxylic acid dichloride and 6.1 g (0.03 mole) of isophthalic acid dichloride were added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 40.0 g (0.01 mole) of poly(propylene glycol)bis(2-aminopropyl ether) (manufactured by ALDRICH Company; the number-average molecular weight: 4,000) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 91.3 g of a copolymer was obtained. The molecular weight of the obtained copolymer was measured by a GPC apparatus manufactured by TOSO Co., Ltd. as the molecular weight of the corresponding polystyrene. The weight-average molecular weight was 26,000 and the molecular weight distribution was 2.2. The fraction of the reactive oligomer component introduced into the copolymer was obtained in accordance with $^1$NMR and found to be 35.05% by weight.

A sample for evaluation was obtained from the copolymer obtained above in accordance with the same procedures as those conducted in Example 1. The results of the measurements are shown together in Table 1.

Comparative Example 1

2,2-bis(3-Amino-4-hydroxyphenyl)hexafluoropropane in an amount of 34.8 g (0.095 mole) was dissolved into 330 ml of dry N-methyl-2-pyrrolidone. To the resultant solution, 7.7 g (0.1 mole) of 5-ethynyl-2,6-naphthalenedicarboxylic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 53.5 g of a copolymer was obtained. The molecular weight of the obtained copolymer was measured by a GPC apparatus manufactured by TOSO Co., Ltd. as the molecular weight of the corresponding polystyrene. The weight-average molecular weight was 25,600 and the molecular weight distribution was 2.23.

A sample for evaluation was obtained from the copolymer obtained above in accordance with the same procedures as those conducted in Example 1. The results of the measurements are shown together in Table 1.

Comparative Example 2

2,2-bis(3-Amino-4-hydroxyphenyl)hexafluoropropane in an amount of 34.8 g (0.095 mole) was dissolved into 330 ml of dry N-methyl-2-pyrrolidone. To the resultant solution, 20.3 g (0.1 mole) of terephthalic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 28 g (0.01 mole) of polypropylene glycol)-block-(poly(ethylene glycol) having hydroxyl group at the chain ends (the number-average molecular weight: 2,800) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 50.3 g of a copolymer was obtained. The molecular weight of the obtained copolymer was measured by a GPC apparatus manufactured by TOSO Co., Ltd. as the molecular weight of the corresponding polystyrene. The weight-average molecular weight was 20,100 and the molecular weight distribution was 2.22. The fraction of the reactive oligomer component introduced into the copolymer was obtained in accordance with $^1$NMR and found to be 33% by weight.

A sample for evaluation was obtained from the copolymer obtained above in accordance with the same procedures as those conducted in Example 1. The results of the measurements are shown together in Table 1.

Comparative Example 3

2,2-bis(3-Amino-4-hydroxyphenyl)hexafluoropropane in an amount of 36.4 g (0.0995 mole) was dissolved into 330 ml of dry N-methyl-2-pyrrolidone. To the resultant solution, 22.7 g (0.1 mole) of 5-ethynylterephthalic acid dichloride was added under dry nitrogen at 10° C. After the addition was completed, the resultant solution was stirred at 10° C. for 1 hour and then at 20° C. for 1 hour. After the temperature was adjusted to 10° C., 22.3 g (0.22 mole) of triethylamine was added and then a solution prepared by dissolving 50.0 g (0.001 mole) of the polystyrene having 4-aminobenzoic acid group at the chain ends which was prepared in Preparation Example 3 (the number-average molecular weight: 50,000) into 100 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 6.6 liters of ion-exchanged water and 6.6 liters of isopropanol. The precipitates were collected and dried and 81.4 g of a copolymer was obtained. The molecular weight of the obtained copolymer was measured by a GPC apparatus manufactured by TOSO Co., Ltd. as the molecular weight of the corresponding polystyrene. The weight-average molecular weight was 80,000 and the molecular weight distribution was 2.12. The fraction of the reactive oligomer component introduced into the copolymer was obtained in accordance with $^1$NMR and found to be 42% by weight.

A sample for evaluation was obtained from the copolymer obtained above in accordance with the same procedures as those conducted in Example 1. The results of the measurements are shown together in Table 1.

Comparative Example 4

9,9-bis(4-((4-Amino-3-hydroxy)phenoxy)phenyl)fluorene in an amount of 126.2 g (0.22 mole) was dissolved into 600 ml of dry N-methyl-2-pyrrolidone. To the resultant solution, 27.8 g (0.1 mole) of 4,4'-biphenyldicarboxylic acid dichloride, 20.3 g (0.1 mole) of terephthalic acid dichloride and 4.8 g (0.024 mole) of isophthalic acid dichloride were added under dry nitrogen at 10° C. After the addition was completed, the resultant solution was stirred at 10° C. for 1 hour and then at 20° C. for 1 hour. After the temperature was adjusted to 10° C., 49.8 g (0.49 mole) of triethylamine was added and then a solution prepared by dissolving 94.1 g (0.024 mole) of polypropylene glycol)bis(2-aminopropyl ether) (manufactured by ALDRICH Company; the number-average molecular weight: 4,000) into 250 ml of γ-butyrolactone was added under dry nitrogen at 10° C. After the addition was completed, the reaction solution was stirred at 10° C. for 1 hour and then at 20° C. for 20 hours. After the reaction was completed, the reaction liquid was filtered and triethylamine hydrochloride was removed. The filtrate was added dropwise to a mixed solution containing 18 liters of ion-exchanged water and 18 liters of isopropanol. The precipitates were collected and dried and 210.4 g of a copolymer was obtained. The molecular weight of the obtained copolymer was measured by a GPC apparatus manufactured by TOSO Co., Ltd. as the molecular weight of the corresponding polystyrene. The weight-average molecular weight was 24,000 and the molecular weight distribution was 2.10. The fraction of the reactive oligomer component introduced into the copolymer was obtained in accordance with $^1$NMR and found to be 34% by weight.

A sample for evaluation was obtained from the copolymer obtained above in accordance with the same procedures as those conducted in Example 1. The results of the measurements are shown together in Table 1.

TABLE 1

| | Specific permittivity | Heat resistance (° C.) | Tg (° C.) | Water absorption (% by wt.) | Observation of fine pores |
|---|---|---|---|---|---|
| Example 1 | 2.1 | 543 | >450 | 0.2 | fine pores of 15 nm or smaller |
| Example 2 | 1.7 | 545 | >450 | 0.3 | fine pores of 10 nm or smaller |
| Example 3 | 2.2 | 539 | >450 | 0.3 | fine pores of 10 nm or smaller |
| Example 4 | 2.1 | 542 | >450 | 0.3 | fine pores of 8 nm or smaller |
| Example 5 | 2.0 | 560 | >450 | 0.2 | fine pores of 10 nm or smaller |
| Example 6 | 1.9 | 562 | >450 | 0.2 | fine pores of 9 nm or smaller |
| Example 7 | 1.9 | 555 | >450 | 0.2 | fine pores of 10 nm or smaller |
| Example 8 | 2.1 | 544 | >450 | 0.2 | fine pores of 10 nm or smaller |
| Example 9 | 2.2 | 548 | >450 | 0.2 | fine pores of 10 nm or smaller |
| Example 10 | 2.1 | 547 | 456 | 0.2 | fine pores of 10 nm or smaller |
| Example 11 | 1.9 | 568 | 447 | 0.2 | fine pores of 10 nm or smaller |
| Example 12 | 1.9 | 523 | 415 | 0.2 | fine pores of 10 nm or smaller |
| Comparative Example 1 | 2.8 | 545 | >450 | 0.2 | no fine pores observed |
| Comparative Example 2 | 2.8 | 539 | 376 | 0.2 | no fine pores observed |
| Comparative Example 3 | *1 | 546 | >450 | 0.3 | voids of 1 μm or larger |

TABLE 1-continued

| | Specific permittivity | Heat resistance (° C.) | Tg (° C.) | Water absorption (% by wt.) | Observation of fine pores |
|---|---|---|---|---|---|
| Comparative Example 4 | *1 | 533 | 380 | 0.3 | no pores observed |

*1: The permittivity could not be obtained due to short circuit during the measurement.

When a copolymer was prepared and evaluated in accordance with the same procedures as those conducted in Example 2 except that the amount of the reactive oligomer was increased to 72% by weight, the formed pores were continuous although the diameter was as small as 20 nm or smaller. The specific permittivity could not be obtained since the film was very fragile.

It is shown by the results in Table 1 that the insulation films obtained from the material for an insulation film of the present invention could exhibit low permittivities while the excellent heat resistance and the small water absorption were maintained. The fraction of pores calculated from the measured permittivity in accordance with a logarithmic equation of mixing agreed well with the amount of the reactive oligomer introduced into the copolymer.

What is claimed is:

1. A material for an insulating film which comprises, as a component forming the film, a copolymer obtained by reacting a polyamide represented by following formula [1] with a reactive oligomer having a substituent which can react with carboxyl group, amino group or hydroxyl group in a structure of the polyamide:

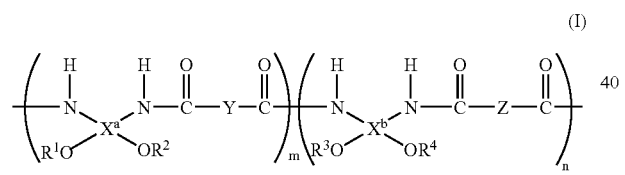

(I)

wherein $R^1$ to $R^4$ each independently represent hydrogen atom or a monovalent organic group, $X^a$ and $X^b$ each represents a tetravalent group selected from groups represented by following formulae (A), wherein $X^a$ and $X^b$ may be the same with or different from each other, Y represents at least one divalent group selected from groups represented by following formulae (B), (C), (D) and (B), Z represents a divalent group selected from groups represented by following formulae (F), m and n each represent an integer satisfying relations of $m > 0$, $n \geq 0$, $2 \leq m+n \leq 1{,}000$ and $0.05 \leq m/(m+n) \leq 1$ and arrangement of repeating units in said polyamide represented by formula (1) may be a block arrangement or a random arrangement;

Formulae (A)

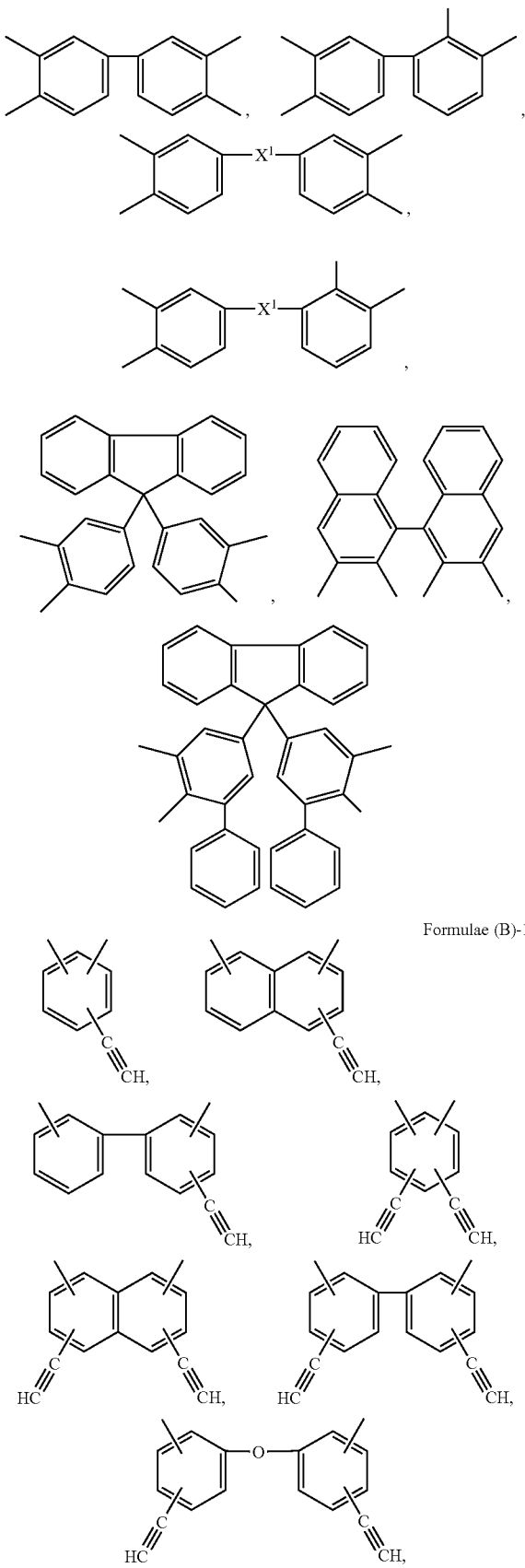

Formulae (B)-1

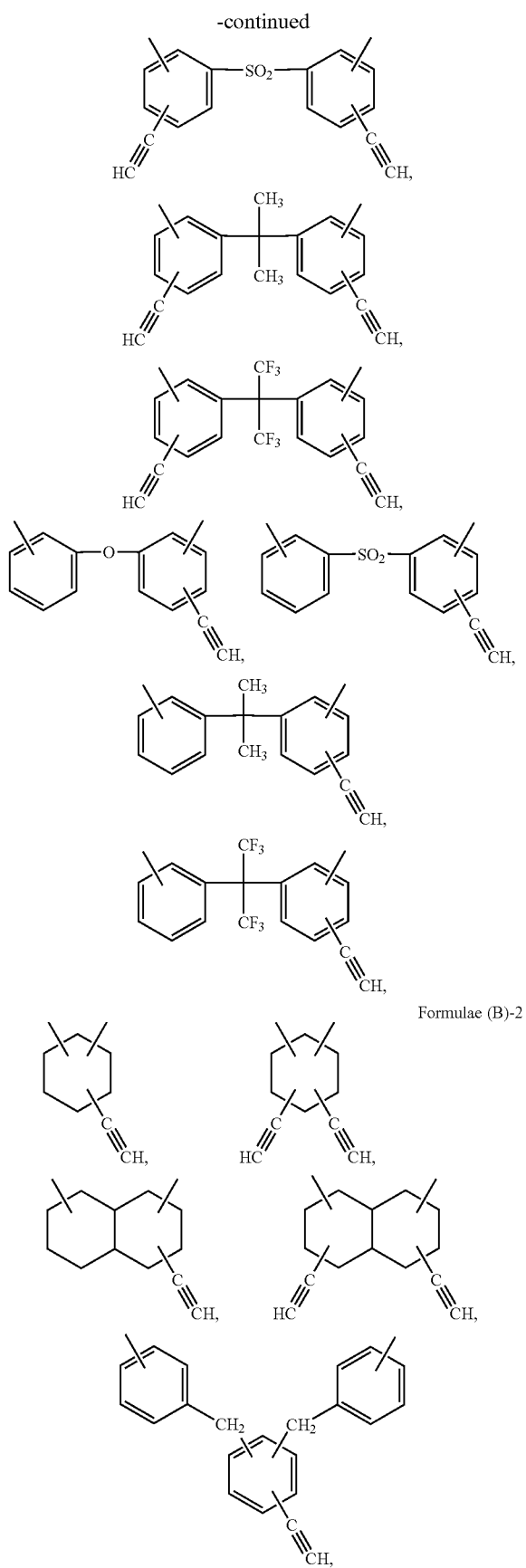
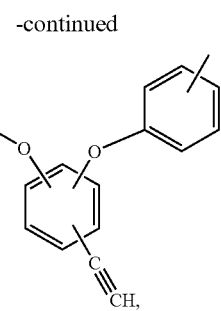
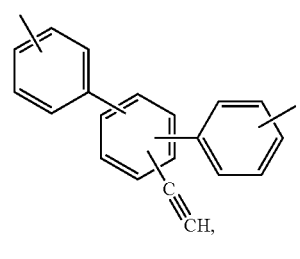
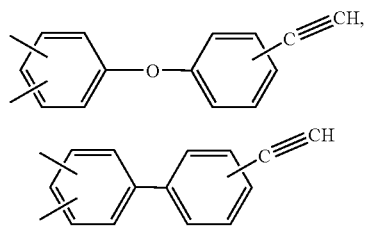
Formulae (C)-1
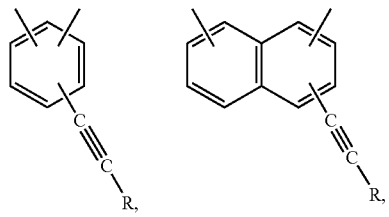
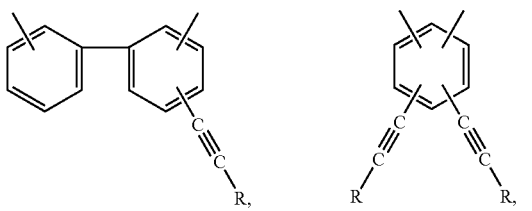
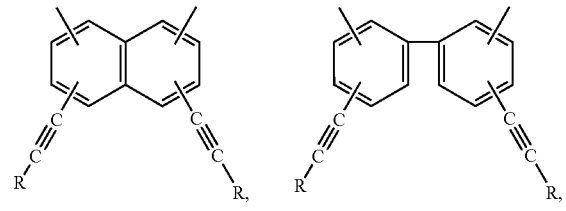
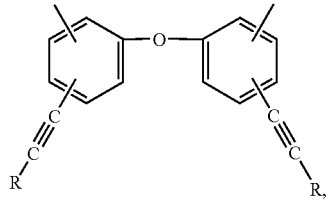

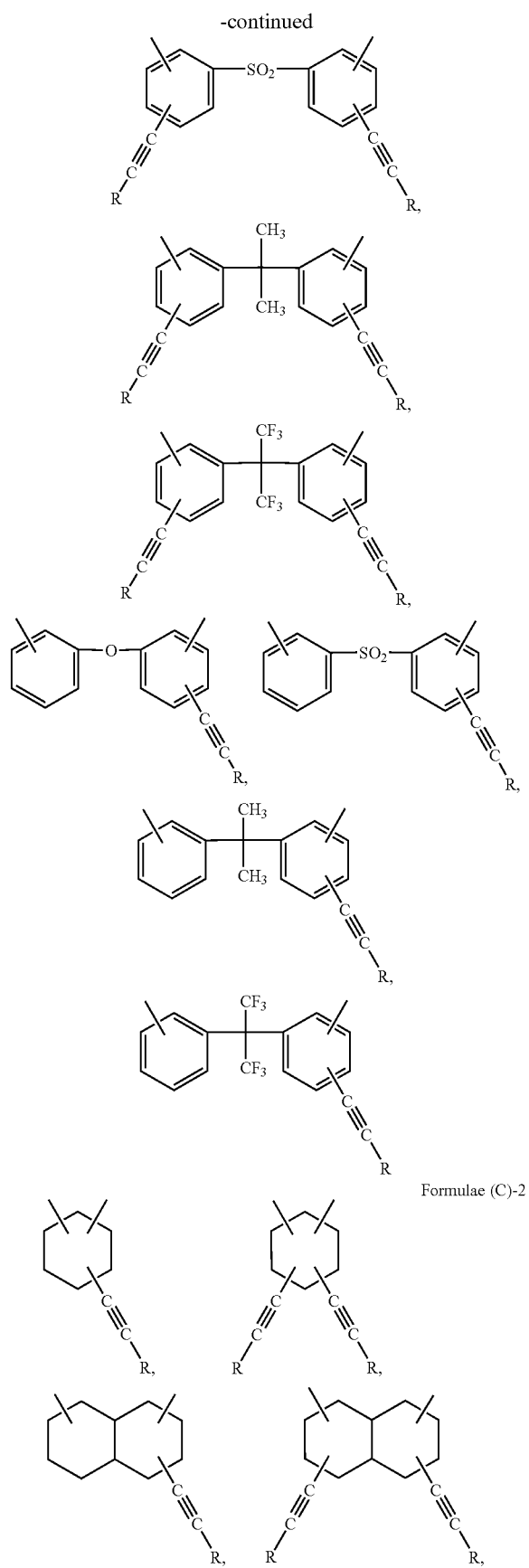
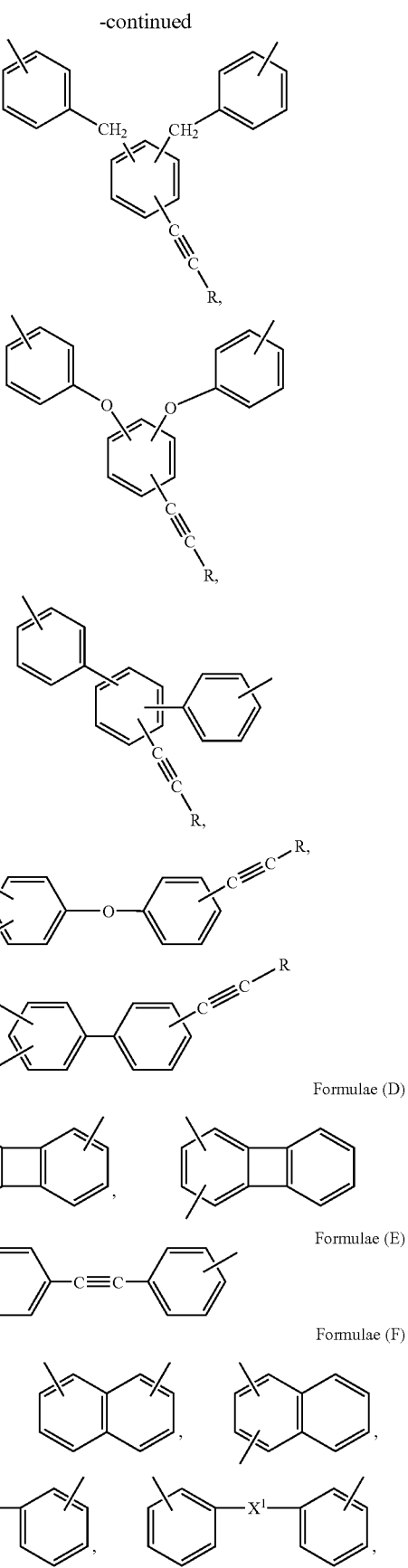
Formulae (D)
Formulae (E)
Formulae (F)

-continued

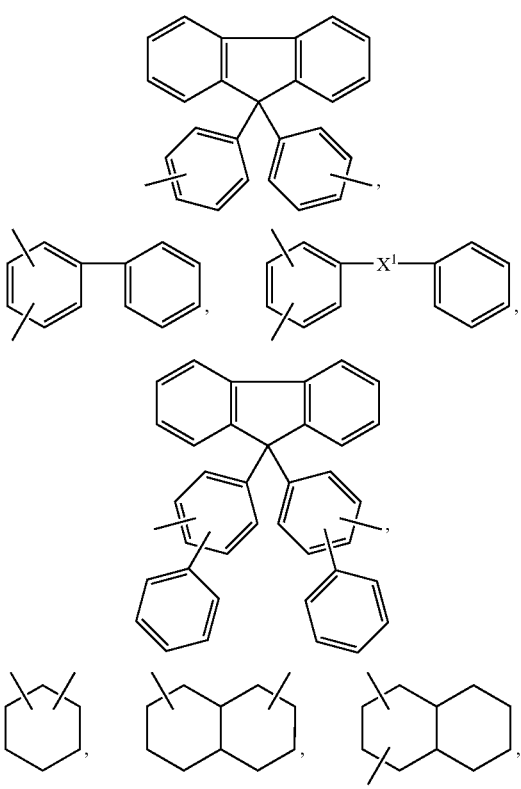

wherein X¹ in formulae (A) and (F) represents a divalent group selected from groups represented by following formulae (G):

R in formulae (C) represents an alkyl group or a monovalent group selected from groups selected from groups represented by formulae (H):

and hydrogen atoms on a benzene ring in groups represented by Formulae (A), (B), (C), (D), (E), (F) and (G) may be substituted with at least one atom or group selected from alkyl groups having 1 to 4 carbon atom, fluorine atom and trifluoromethyl group.

2. A material for an insulating film according to claim 1, wherein the polyamide is represented by formula [1] in which Y represents a divalent group selected from the groups represented by formulae (C).

3. A material for an insulating film according to claim 1, wherein the reactive oligomer is at least one oligomer selected from polyoxyalkylenes, polymethyl methacrylate, poly-.alpha.-methylstyrene, polystyrene, polyesters, polyether esters, polycaprolactone and polyurethanes.

4. A material for an insulating film according to claim 1, wherein the reactive oligomer has a number-average molecular weight in a range of 100 to 40,000.

5. A material for an insulating film according to claim 4, wherein the reactive oligomer has a number-average molecular weight in a range of 100 to 20,000.

6. A material for an insulating film according to claim 5, wherein the reactive oligomer has a number-average molecular weight in a range of 100 to 10,000.

7. A material for an insulating film according to claim 1, wherein the copolymer comprises 5 to 70% by weight of a unit of the reactive oligomer.

8. A material for an insulating film according to claim 7, wherein the copolymer comprises 5 to 50% by weight of a unit of the reactive oligomer.

9. A material for an insulating film according to claim 8, wherein the copolymer comprises 5 to 40% by weight of a unit of the reactive oligomer.

10. A coating varnish for an insulating film which comprises a material for an insulating film described in claim 1 and an organic solvent in which the material for an insulating film can be dissolved or dispersed.

* * * * *